United States Patent
Suzuki et al.

(10) Patent No.: US 8,975,626 B2
(45) Date of Patent: Mar. 10, 2015

(54) FLEXIBLE SEMICONDUCTOR DEVICE

(75) Inventors: Takeshi Suzuki, Osaka (JP); Kenichi Hotehama, Osaka (JP); Koichi Hirano, Osaka (JP); Seiichi Nakatani, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 417 days.

(21) Appl. No.: 12/863,202

(22) PCT Filed: Nov. 13, 2009

(86) PCT No.: PCT/JP2009/006071
§ 371 (c)(1),
(2), (4) Date: Aug. 26, 2010

(87) PCT Pub. No.: WO2010/058541
PCT Pub. Date: May 27, 2010

(65) Prior Publication Data
US 2011/0042677 A1    Feb. 24, 2011

(30) Foreign Application Priority Data
Nov. 18, 2008    (JP) ................ P2008-294119

(51) Int. Cl.
*H01L 33/08* (2010.01)
*H01L 29/66* (2006.01)
*H01L 29/786* (2006.01)

(52) U.S. Cl.
CPC ........ *H01L 29/66742* (2013.01); *H01L 29/786* (2013.01); *H01L 29/78603* (2013.01); *H01L 29/66765* (2013.01); *H01L 29/78681* (2013.01); *H01L 29/7869* (2013.01)
USPC ....................................... 257/59

(58) Field of Classification Search
CPC .................. H01L 29/66765; H01L 29/78681; H01L 29/7869
USPC ................ 257/25, 57, 59, 66, 344, 347, 412; 438/3, 158, 163, 180, 216, 254, 287
See application file for complete search history.

(56) References Cited

U.S. PATENT DOCUMENTS 3,877,055 A * 4/1975 Fisher et al. .................. 257/326
4,907,048 A * 3/1990 Huang .......................... 257/344
(Continued)

FOREIGN PATENT DOCUMENTS

| JP | 2004-297084 | 10/2004 |
| JP | 2005-166742 | 6/2005 |

(Continued)

OTHER PUBLICATIONS

English translation of International Preliminary Report on Patentability and Written Opinion of the International Searching Authority (Chapter I) (in English), issued Jun. 30, 2011 in PCT/JP2009/006071.

(Continued)

*Primary Examiner* — Marcos D. Pizarro
*Assistant Examiner* — Sue Tang
(74) *Attorney, Agent, or Firm* — Wenderoth, Lind & Ponack, L.L.P.

(57) ABSTRACT

There is provided a flexible semiconductor device. The flexible semiconductor device of the present invention comprises a metal layer comprising a gate electrode, a source electrode and a drain electrode; a metal oxide film made from a metal which constitutes the metal layer and formed over a surface region of the metal layer; and a semiconductor layer formed above the gate electrode via the metal oxide film. In the flexible semiconductor device, uncovered portions, each of which is not covered with the metal oxide film, are locally formed in the surface region of the metal layer; and also electrical connections are formed between the source electrode and the semiconductor layer and between the drain electrode and the semiconductor layer via the uncovered portions.

12 Claims, 20 Drawing Sheets

(56) References Cited

U.S. PATENT DOCUMENTS

| | | | |
|---|---|---|---|
| 5,159,477 A * | 10/1992 | Shimada et al. | 349/39 |
| 5,897,345 A * | 4/1999 | Uochi | 438/151 |
| 7,177,003 B2 * | 2/2007 | Kim | 349/147 |
| 2003/0104673 A1 * | 6/2003 | See et al. | 438/393 |
| 2005/0127417 A1 * | 6/2005 | Saenger et al. | 257/295 |
| 2005/0162421 A1 | 7/2005 | Yamazaki et al. | |
| 2005/0162578 A1 | 7/2005 | Yamazaki et al. | |
| 2005/0179036 A1 * | 8/2005 | Yamazaki et al. | 257/66 |
| 2006/0079005 A1 * | 4/2006 | Brask et al. | 438/3 |
| 2007/0052019 A1 * | 3/2007 | Rudin | 257/347 |
| 2010/0012936 A1 | 1/2010 | Hirano et al. | |

FOREIGN PATENT DOCUMENTS

| | | |
|---|---|---|
| JP | 2007-67263 | 3/2007 |
| JP | 2007-73857 | 3/2007 |
| WO | 2009/063583 | 5/2009 |
| WO | 2009/069248 | 6/2009 |

OTHER PUBLICATIONS

International Search Report issued Dec. 15, 2009 in International (PCT) Application No. PCT/JP2009/006071.

* cited by examiner

Fig. 3
(a) 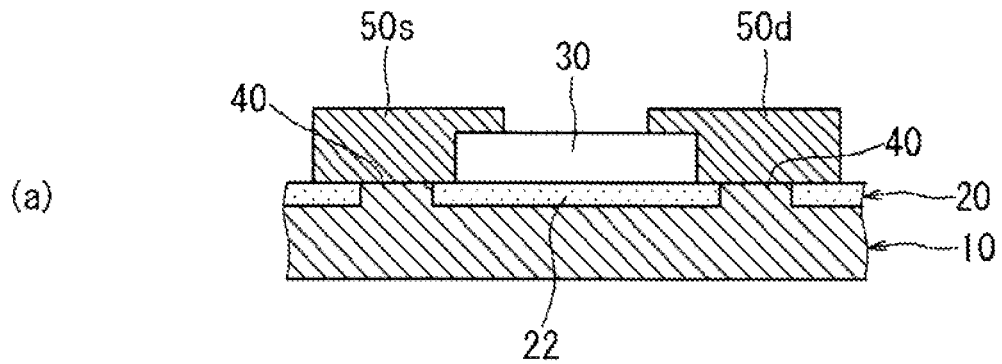
(b) 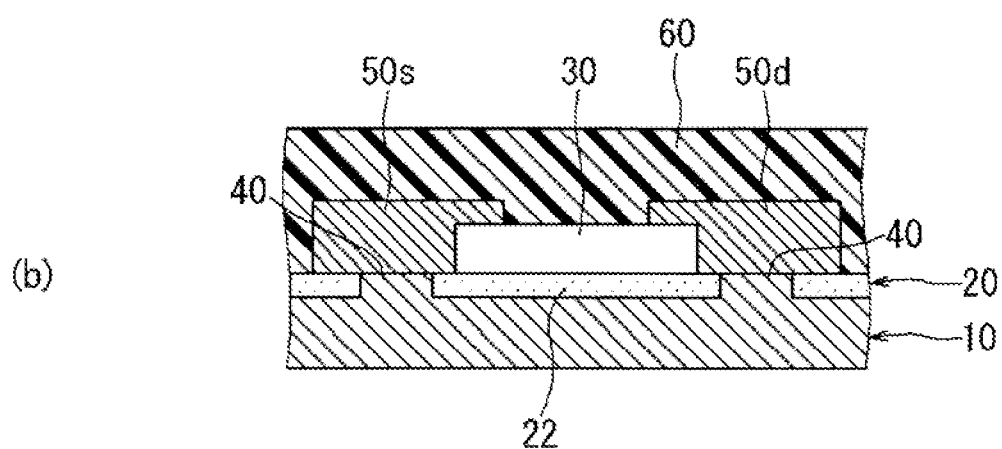
(c) 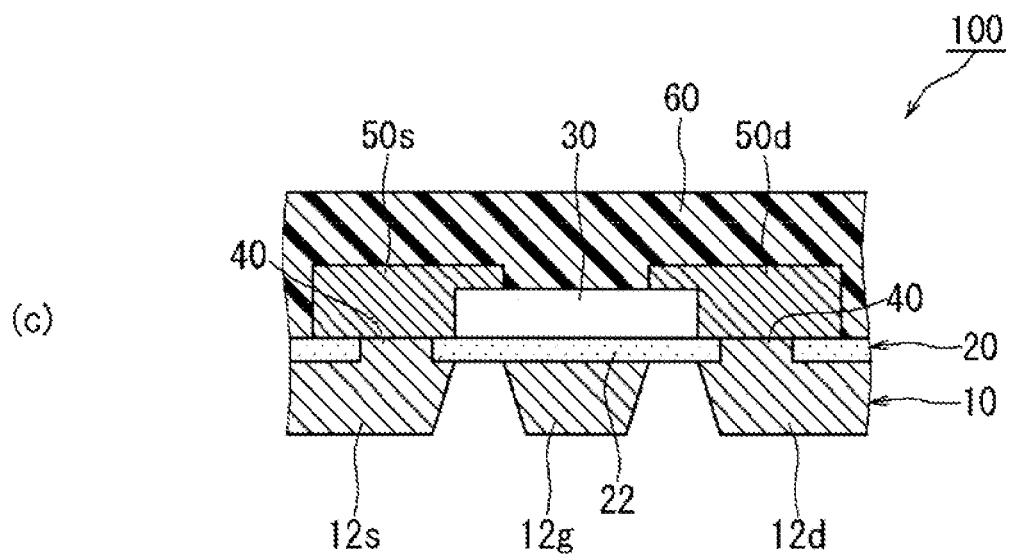

Fig. 5
(a)
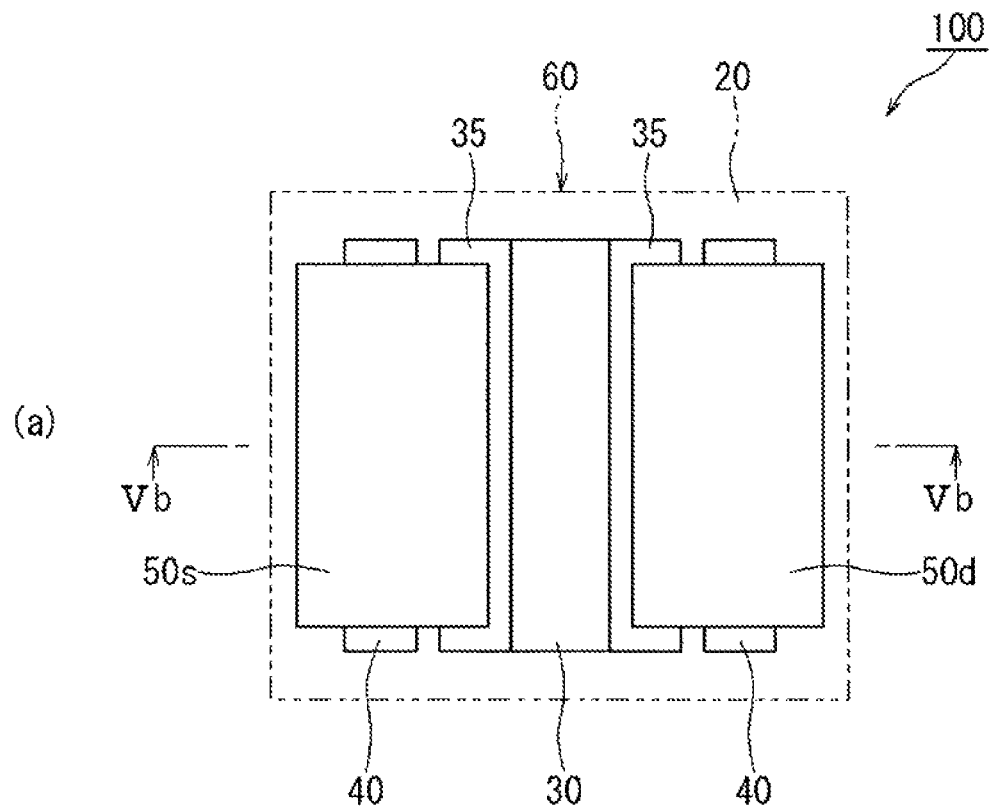
(b)
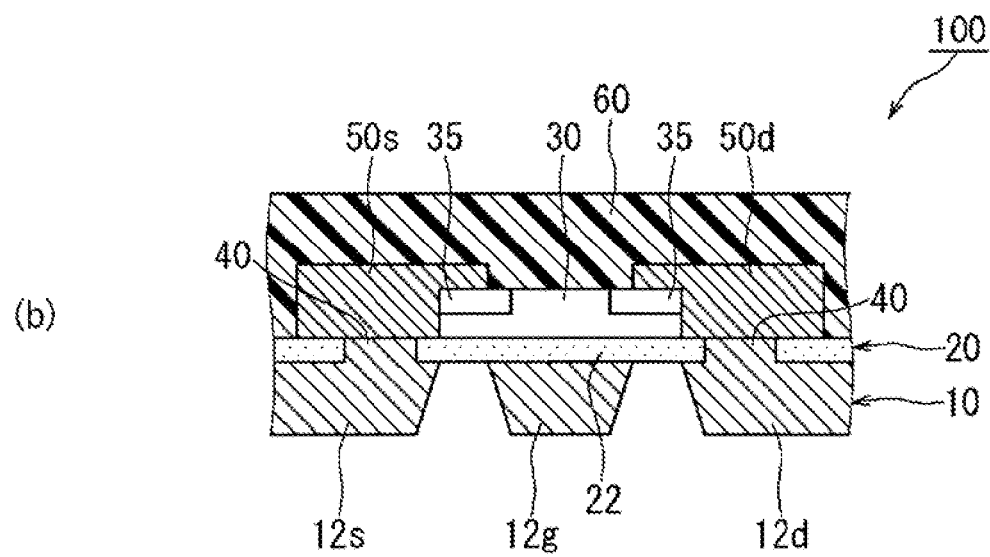

Fig. 8
(a)
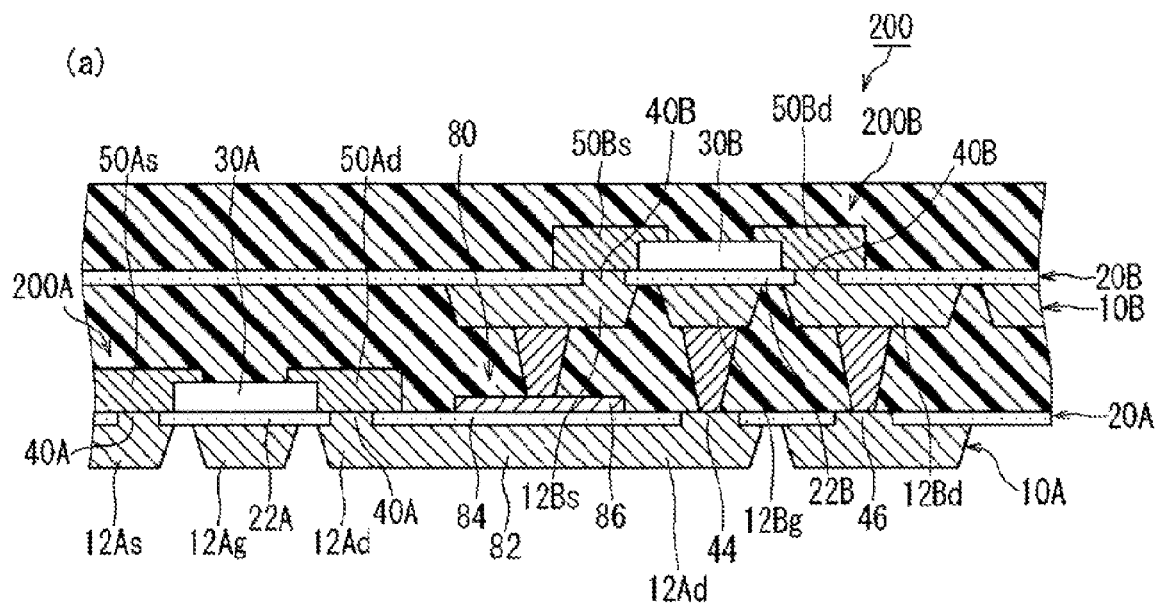
(b)
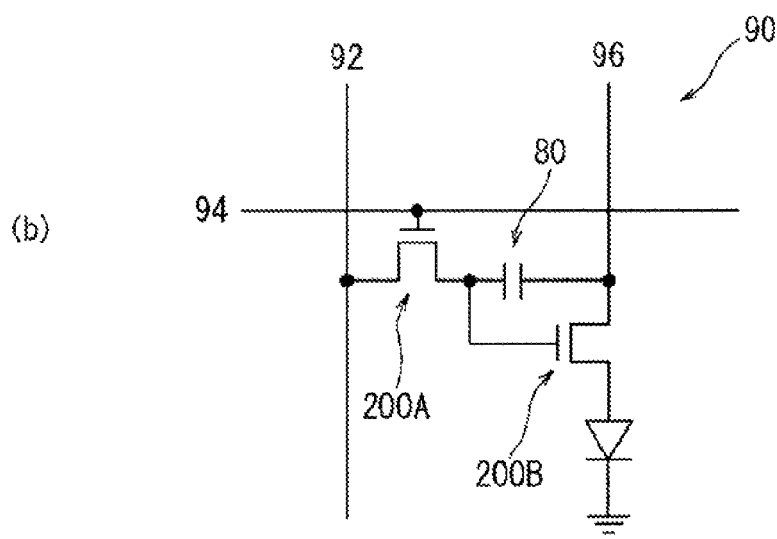

Fig. 9
(a)
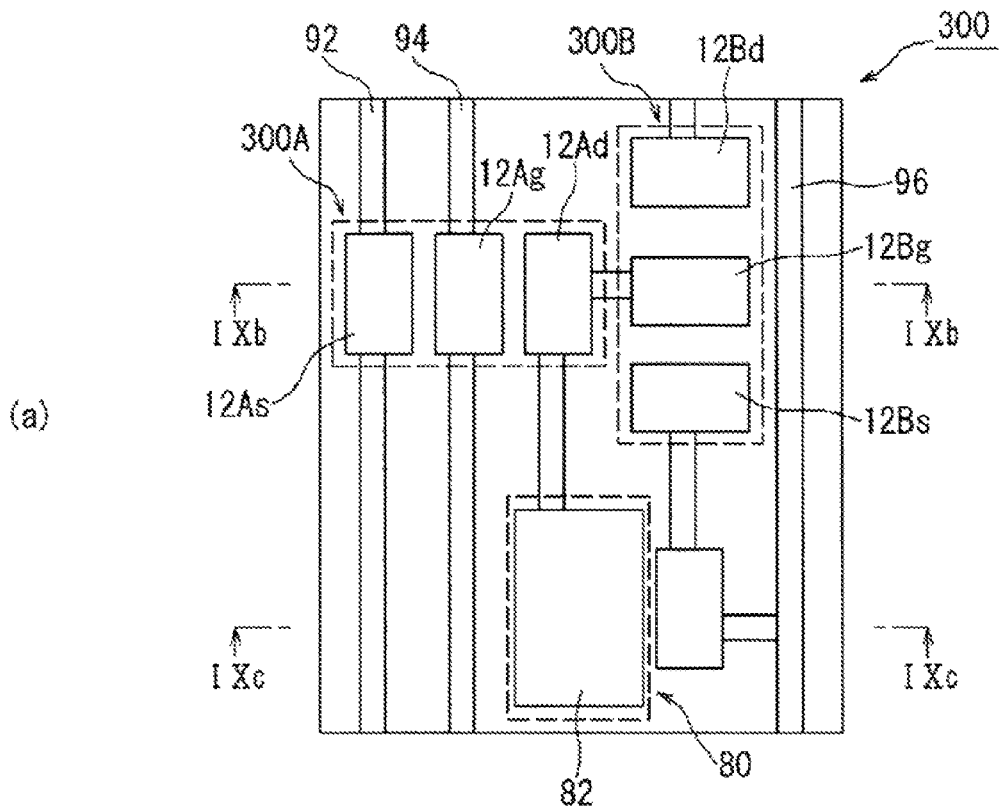
(b)
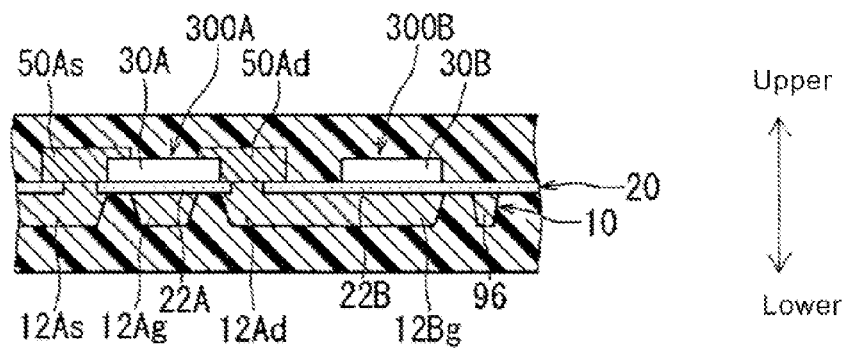
(c)
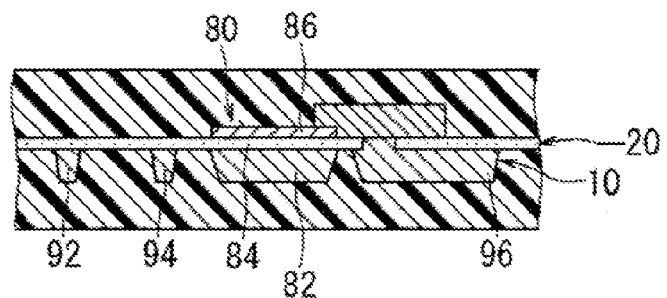

100, 200, 300, 400, 500

100, 200, 300, 400, 500

100, 200, 300, 400, 500

100, 200, 300, 400, 500

100, 200, 300, 400, 500

FLEXIBLE SEMICONDUCTOR DEVICE

TECHNICAL FIELD

The present invention relates to a flexible semiconductor device with its flexibility, and also a method for manufacturing the same. In particular, the present invention relates to the flexible semiconductor device which can be used as a TFT, and also the method for manufacturing the same.

BACKGROUND OF THE INVENTION

There is a growing need for a flat-panel display as an image display device with a wide spreading use of information terminals. With further advancement of informatization, there are also increasing opportunities in which information, which has been conventionally provided by paper medium, is digitized. Particularly, the needs for an electronic paper or a digital paper have been recently increasing since they are thin and light weight mobile display media which can be easily held and carried (see Patent document 1, described below).

Generally, the display medium of a flat panel display device is formed by using an element such as a liquid crystal, an organic EL (organic electroluminescence) and an electrophoresis. In such display medium, a technology which uses an active drive element (TFT element) as an image drive element has become a mainstream in order to secure a uniformity of the screen luminosity and a screen rewriting speed and so forth. In the conventional display device, TFT elements are formed on a glass substrate, and a liquid crystal element, an organic EL element or the like is sealed.

As a TFT element, semiconductors including a-Si (amorphous silicon) and p-Si (polysilicon) can be mainly used. These Si semiconductors (together with metal films, as necessary) are multilayered, and also each of a source electrode, a drain electrode and a gate electrode is sequentially stacked on a substrate, which leads to an achievement of the production of the TFT element.

The conventional method of manufacturing a TFT element using Si materials includes one or more steps with a high temperature, so that there is an additional restriction that the material of the substrate should resists a high process temperature. For this reason, it is required in practice to use a glass as the material of the substrate. In the meanwhile, it may be possible to use a quartz substrate. However a quartz substrate is so expensive that an economical problem arises when scaling up of the display panels. Therefore a glass substrate is generally used as a substrate for forming such TFT elements.

However, when the thin display panel as described above is produced by using the conventionally known glass substrate, there is a possibility that such display panel has a heavy weight, lacks flexibility and breaks due to a shock when it is fallen down. These problems, which are attributable to the formation of a TFT element on a glass substrate, are so undesirable in light of the needs for a portable thin display having light weight with the advancement of informatization.

From the standpoint of obtaining a substrate having flexibility and light weight so as to meet the needs for a lightweight and thin display, there is a development of a flexible semiconductor device wherein TFT elements are formed on a resin substrate (i.e. plastic substrate). For example, Patent document 2 (see below) discloses a technique in which a TFT element is formed on a substrate (i.e. glass substrate) by a process which is almost the same as conventional process, and subsequently the TFT element is peeled from the glass substrate and then transferred onto a resin substrate. In this technique, a TFT element is formed on a glass substrate and the TFT element together with the glass substrate is adhered to a resin substrate via a sealing layer (e.g. an acrylic resin layer), and subsequently the glass substrate is finally peeled thereof. As a result, the TFT element can be transferred onto the resin substrate.

In the method for manufacturing a TFT element using such a transference process, there is, however, a problem in the peeling step of the substrate (i.e. glass substrate). In other words, it is necessary to perform an additional treatment to decrease the adhesion between the substrate and the TFT element upon peeling the substrate from the resin substrate. Alternatively it is necessary to perform an additional treatment to form a peel layer between the substrate and the TFT element and to physically or chemically remove a peel layer afterward. These additional treatments make the process complicated, so that another problem concerning productivity is caused.

PATENT DOCUMENTS

[Patent document 1] Japanese Unexamined Patent Publication (Kokai) No. 2007-67263; and
[Patent document 2] Japanese Unexamined Patent Publication (Kokai) No. 2004-297084.

SUMMARY OF THE INVENTION

Problems to be Solved by the Invention

It is considered to directly form a TFT element on the resin board (or plastic plate), not transferring the TFT element onto the resin board. In this case, a peeling step (or removing step) of the support (i.e. glass substrate) after the transfer becomes unnecessary, and thus a flexible semiconductor device can be simply and easily manufactured.

However, since the resin board made of the acrylic resin or the like has a low heat resistance, the process temperature is restricted to be kept as low as possible upon producing the TFT elements. Therefore, the TFT elements that are directly formed on the resin board have concerns about the TFT performance, as compared with the TFT elements that are formed through the transference process.

For example, it is desirable to apply a heat treatment to the semiconductor material in order to improve the semiconductor properties (e.g. mobility). However, in the case where the TFT element is directly formed on the resin board, it is difficult to adopt such heat treatment due to the restricted process temperature. Moreover, in order to decrease a gate voltage, it is desirable to use an inorganic oxide with not only a high dielectric strength voltage, but also its thinness as a gate insulating film and also a high dielectric constant. However, those inorganic oxides have such a problem to be improved in the production technology thereof that it is not easy to perform a machining (e.g. laser machining) due to the fact that the inorganic oxides are densified and have chemical stability. In particular, such problem becomes significant when it comes to the flexible semiconductor device for a large sized screen.

The inventors of the present application tried to dissolve such problems not by following up the conventional way, but by focusing on a new way. The present invention has been accomplished in view of the above matters, and a main object of the present invention is to provide a method for manufacturing a flexible semiconductor device which is excellent in productivity and thereby a flexible semiconductor device with a high performance is provided.

Means for Solving the Problem

In order to solve the above-mentioned problems, the present invention provides a method for manufacturing a flexible semiconductor device comprising the steps of:

(i) providing a metal foil (or metal layer);

(ii) oxidizing a surface region of the metal foil, and thereby forming a gate insulating film of a metal oxide film made from a metal which constitutes the metal foil;

(iii) forming a semiconductor layer on the gate insulating film; and (iv) subjecting the metal foil to an etching treatment, and thereby forming a gate electrode, a source electrode and a drain electrode from the metal foil, wherein, in the step (ii), non-oxidized portion is formed in the surface region of the metal foil by preventing the oxidation of at least one portion of the surface region of the metal foil; and wherein the semiconductor layer is electrically interconnected with each of the source and drain electrodes via the non-oxidized portions. It is preferred that the metal foil comprises a valve metal and that, in the step (ii), the surface region of the metal foil is anodically oxidized to produce the metal oxide film from the valve metal, in which case such metal oxide film is used as the gate insulating film. It is also preferred that a resin layer is formed over the metal oxide film after the step (iii), so that the semiconductor layer is covered with the resin layer.

For one thing, the manufacturing method of the flexible semiconductor device of the present invention is characterized in that the oxidation treatment of the surface region of the metal foil is locally and selectively performed, and that "metal oxide film" obtained therefrom is used as the gate insulating film, and the "non-oxidized portion" is used as a via (i.e. an interlayer connecting portion). The manufacturing method of the present invention is also characterized in that the metal foil, which has been used as a raw material of the metal oxide film (i.e. "gate insulating film"), is also used as a constituent material of the electrodes (i.e. a constituent element of the flexible semiconductor device).

The term "flexible" of the "flexible semiconductor device" used in the present description substantially means that the semiconductor device has such a flexibility characteristic that the device can be inflected. The "flexible semiconductor device" of the present invention may be referred to as "flexible semiconductor element", in view of the structure thereof.

The local oxidation treatment of the metal foil according to the present invention produces "portion which has been oxidized" and "portion which has not been oxidized". In this regard, the term "non-oxidized portion" used in the present description means the above "portion which has not been oxidized".

Furthermore, the phrase "constituent material of the electrodes" used in the present description substantially means a material or member which is capable of forming TFT element's electrodes (i.e. "source electrode", "drain electrode" and "gate electrode" and the like) by subjecting it to an etching treatment or the like.

In one preferred embodiment, in the step (ii), a resist is provided in the surface region of the metal foil, which region is intended to form the non-oxidized region. Thereafter, an oxidation treatment is wholly applied to the surface region with the resist provided thereon.

In the manufacturing method of the present invention, the semiconductor layer and the non-oxidized region are electrically connected to each other. In this regard, a technical way for interconnecting the semiconductor layer and the non-oxidized region is not particularly limited. For example, subsequent to the step (iii), an extraction electrode is formed such that the extraction electrode may be in contact with the semiconductor layer and the non-oxidized portion. Alternatively, in the step (iii), the semiconductor layer may be formed such that the semiconductor layer is in a direct contact with the non-oxidized portion.

According to the present invention, it is capable that the process for forming the semiconductor layer is performed as a high temperature process of 180° C. or more, preferably from 400° C. to 1000° C. The reason for this is that the present invention uses the metal foil. For this reason, it is capable that a heat treatment is applied to the formed semiconductor layer. In this case, it is preferred that a thermal annealing treatment and/or a laser annealing treatment is performed as the heat treatment. Such heat treatment can improve the performances of the obtained TFT elements. Specifically, for example in a case where the semiconductor layer is made of silicon, a carrier mobility thereof can be improved due to a promoted crystallization of the semiconductor material. In another case where the semiconductor layer is made of an amorphous oxide (IGZO), the carrier mobility thereof can be improved due to the restored oxygen defect.

The manufacturing method of the present invention may further comprise a step of forming a capacitor by using the metal foil and the metal oxide film. In this case, it is preferred that an etching is performed on the metal foil to form not only the TFT electrodes but also an electrode layer of the capacitor. In addition, it is preferred that not only a part of the metal oxide film is used as the gate insulating film, but also another part of the metal oxide film is used as a dielectric layer of the capacitor.

The present invention further provides a flexible semiconductor device which is obtained by the above manufacturing method. Such flexible semiconductor device comprises:

a metal layer comprising a gate electrode, a source electrode and a drain electrode;

a metal oxide film made from a metal which constitutes the metal layer and formed over a surface region of the metal layer; and a semiconductor layer formed above the gate electrode via the metal oxide film, wherein uncovered portions, each of which is not covered with the metal oxide film, are locally formed in the surface region of the metal layer; and wherein, via the uncovered portions, the source electrode and the semiconductor layer are electrically interconnected, and also the drain electrode and the semiconductor layer are electrically interconnected. It is preferred regarding the flexible semiconductor device of the present invention that a part of the metal oxide film, which part is sandwiched between the gate electrode and the semiconductor layer, can function as a gate insulating film. Moreover, it is preferred that the metal layer is made of a valve metal and thus the metal oxide film is an anodic oxide film made from the valve metal.

For one thing, the flexible semiconductor device of the present invention is characterized in that the device comprises "metal oxide film" and "uncovered portion" which has been obtained by a local oxidation treatment of the metal layer, and that "uncovered portion" functions as a via i.e. an interlayer connecting portion which electrically interconnects between the metal layer (i.e. electrode) and the semiconductor layer.

The flexible semiconductor device of the present invention is also characterized in that both of the "electrode" and "gate insulating film" are originated from the same constituent material. Namely both of them are originated from "metal layer". In other words, the flexible semiconductor device of the present invention has "gate insulating film" formed by a surface oxidation treatment of the metal layer and "electrode" formed by an etching treatment of said metal layer. Due to such characteristics of the flexible semiconductor device of the present invention, the electrode preferably has a tapered form in the thickness direction thereof. In addition, the electrode preferably has a thickness which is larger than that of the conventional electrode produced by a conventional process for forming electrode (for example by a vapor deposition process or a sputtering process). For example, as for the present invention, the electrode has a thickness ranging from 4 μm to about 20 μm. It is preferred that all of the source electrode, the drain electrode and the gate electrode are located on the same plane. In other words, the source electrode, the drain electrode and the gate electrode are flush with each other.

From a standpoint of a "product", the term "uncovered portion" substantially means a portion which is not covered by a metal oxide film. In one preferred embodiment, the "uncovered portion" corresponds to "non-oxidized portion" which is provided in the surface of the metal layer.

In one preferred embodiment, the metal layer comprises a first metal layer and a second metal layer wherein the first metal layer comprises a valve metal, and the second metal layer comprises a metal other than the valve metal. It is preferred in this embodiment that the metal oxide film is an anodic oxide film made from the valve metal of the first metal layer. It is also preferred that an interlayer is formed between the first metal layer and the second metal layer. In these regards, the sentence "the second metal layer comprises a metal other than the valve metal" substantially means that the metal constituent of the second metal layer is different from the metal constituent of the first metal layer, and thus the second metal layer may comprise another valve metal of a different kind from the valve metal of the first metal layer.

The flexible semiconductor device of the present invention may further comprise a capacitor. It is preferred in this case that an electrode layer of the capacitor is formed of the metal layer, and that a dielectric layer of the capacitor is formed of the metal oxide film.

In one preferred embodiment, the flexible semiconductor device comprises a plurality of transistor structures, each of which comprises the semiconductor layer, the gate insulating film, the gate electrode, the source electrode and the drain electrode. In further another preferred embodiment, the flexible semiconductor device is a semiconductor device used for an image display device. In this case, a drive circuit of the image display device comprises the transistor structure and the capacitor of the flexible semiconductor device wherein parts of the metal oxide film are formed in a continuous arrangement in the region that contains the transistor structure and the capacitor.

Effect of the Invention

According to the manufacturing method of the present invention, the metal foil is subjected to an oxidation treatment at the surface area thereof to form the metal oxide film. The resulting oxide film is used as a gate insulating film. Accordingly, in the present invention, the gate insulating film with a thin thickness and its good densified property (i.e. good smoothness) is obtained, which leads to an achievement of the outstanding TFT performances of the flexible semiconductor device.

Moreover, "non-oxidized portion" formed by the local oxidation treatment of the metal foil is used as a via. Due to the via having a form of "non-oxidized portion", a connection among the layers (interlayer connection) can be simply and easily realized without a complicated configuration of the flexible semiconductor device. In addition, it is also unnecessary to remove some parts of the insulating layer after the formation thereof. That is, there is needed no further process for removing the densified and chemically stabilized metal oxide film. Therefore, the raw materials and the energy can be utilized without a wasting thereof, which leads to an achievement of excellent productivity in the manufacturing method of the present invention.

Moreover, according to the present invention, the metal foil, which has been used as a raw material of the metal oxide film (namely, a raw material for "gate insulating film"), is used as the constituent material of the electrodes i.e. the constituent element of the flexible semiconductor device. Consequently, a high temperature process can be positively employed upon the production of the insulating film and the semiconductor layer. This means that the heat treatment can be positively performed for example during or after the formation of the semiconductor layer, and thereby the TFT characteristics (e.g. carrier mobility of the semiconductor) are desirably improved. In other words, the flexible semiconductor device obtained according to the manufacturing method of the present invention has a high performance with respect to the TFT characteristics, due to the desired heat treatment upon the manufacturing thereof.

BRIEF DESCRIPTION OF THE DRAWINGS

FIGS. 3(a) to 3(c) show cross-sectional views illustrating the steps in a manufacturing process of a flexible semiconductor device according to one embodiment of the present invention.

FIG. 5(a) shows a top plan view of the flexible semiconductor device according to one embodiment of the present invention. FIG. 5(b) shows a cross sectional view of the flexible semiconductor device taken along line Vb-Vb of FIG. 5(a).

FIG. 8(a) shows a cross sectional view of the flexible semiconductor device according to one embodiment of the present invention. FIG. 8(b) shows an equivalent circuit diagram regarding a drive circuit of an image display device according to one embodiment of the present invention.

FIG. 9(a) shows a plan view of the flexible semiconductor device in one embodiment of the present invention, which is seen from the metal layer side thereof. FIG. 9(b) shows a cross sectional view taken along line IXb-IXb of FIG. 9(a). FIG. 9(c) shows a cross sectional view taken along line IXc-IXc of FIG. 9(a).

DETAILED DESCRIPTION OF THE INVENTION

Figure 1:
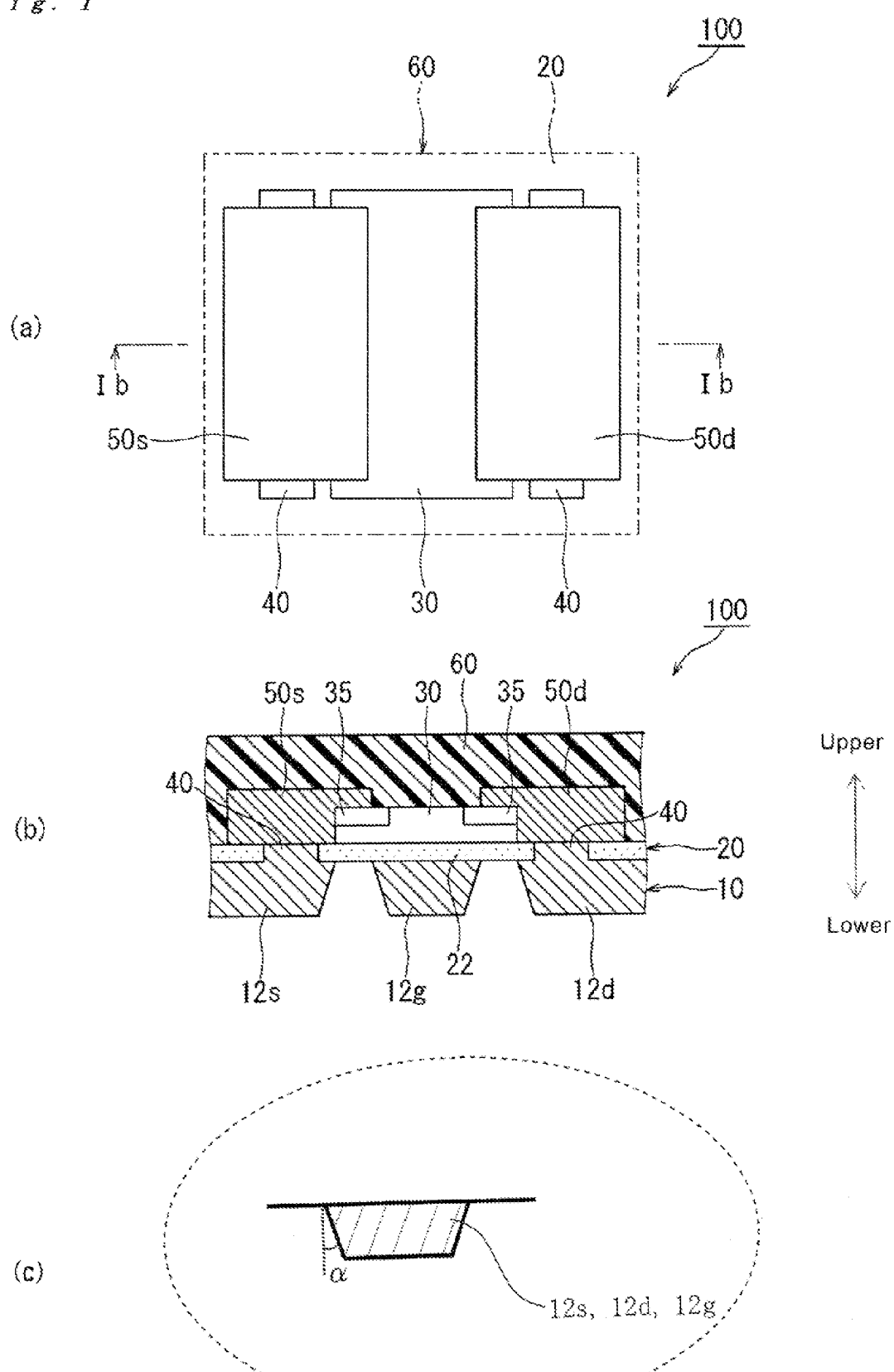
FIG. 1(a) shows a top plan view of the flexible semiconductor device according to one embodiment of the present invention.
FIG. 1(b) shows a cross sectional view taken along line of FIG. 1(a).
FIG. 1(c) shows an enlarged view of the schematic cross section of the electrode.

Hereinafter, some embodiments of the present invention are illustrated with reference to Figures. In the following Figures, the same reference numeral indicates the element which has substantially the same function for simplified explanation. The dimensional relationship (length, width, thickness and so forth) in each Figure does not reflect a practical relationship thereof.

Each "direction" referred to in the present description means the direction based on the spacial relationship between the metal foil/metal layer 10 and the semiconductor layer 30, in which each of upward direction and downward direction is mentioned relating to the direction in the drawings for convenience. Specifically, each of upward direction and downward direction corresponds to the upward direction and downward direction in each drawing. The side on which the gate insulating film 22 or the semiconductor layer 30 is formed based on the metal foil/metal layer 10 is referred to as "upward direction" and the side on which the semiconductor layer 30 is not formed based on the metal foil/metal layer 10 is referred to as "downward direction".

With reference to FIGS. 1(a) to (c), the flexible semiconductor device 100 according to one embodiment of the present invention will be explained. FIG. 1(a) is a schematic top plan view of the flexible semiconductor device 100 whereas FIG. 1(b) is a schematic cross sectional view of the device taken along line Ib-Ib of FIG. 1(a). FIG. 1(c) is an enlarged view of the schematic cross section of the electrode.

The semiconductor device of the present embodiment is a flexible semiconductor device 100 which has flexibility characteristic. This flexible semiconductor device 100 comprises a metal layer 10, a surface metal oxide film 20 and a semiconductor layer 30.

The metal layer 10 has a gate electrode 12g, a source electrode 12s and a drain electrode 12d. It is preferred that the metal constituent of the metal layer 10 has a good electrical conductivity and is capable of readily producing a densified inorganic oxide. For example, a valve metal may be used as the metal of the metal layer 10. It is preferred that the valve metal is at least one kind of metal selected from the group consisting of aluminum, tantalum, niobium, titanium, hafnium, zirconium, molybdenum and tungsten, for example. According to the one embodiment of the present invention, aluminum is used as the valve metal. The metal layer 10 has a thickness in the range of preferably from about 2 μm to about 100 μm, more preferably from about 4 μm to about 20 μm, and still more preferably from about 8 μm to about 16 μm; for example 12 μm.

As shown in FIG. 1(c), each of the gate electrode 12g, the source electrode 12s and the drain electrode 12d may have a tapered form (or tapered shape) in the thickness direction of the electrode due to the fact that each electrode has been produced by subjecting the metal foil to an etching treatment. In the case where the electrode has a tapered form in the thickness direction thereof, the taper angle ($\alpha$) may be in the range of from about 1° to about 60°, for example from about 5° to about 30° (see FIG. 1(c)). when the electrodes of a TFT element has such tapered form, a pattern step coverage can be improved upon sealing and protecting the electrodes and the wiring pattern by the insulating film, which leads to an achievement of a high reliability of the device. According to the present invention, due to the fact that electrodes of the TFT element (i.e. source electrode 12s, the drain electrode 12d and the gate electrode 12g) are obtained by subjecting a metal foil to etching treatment, the electrodes have a larger thickness than that of the electrode produced by the conventional electrode-forming process (e.g. vapor deposition process or sputtering process). For example, each of electrodes according to the present invention has a thickness ranging from 4 μm to about 20 μm, whereas the electrode according to the conventional process has a thickness of about 0.1 μm. As a result of the larger thickness in the present invention, the decreased resistance of the electrodes can be easily achieved. In addition, the thickness of the electrodes can be easily and optionally changed according to the thickness of the metal foil. These mean that a possibility of the electrode design is expanded so that desired TFT characteristics can be more easily provided.

The semiconductor layer 30 is formed above the gate electrode 12g via the surface metal oxide film 20. As shown in the drawings, the semiconductor layer 30 is located on the gate insulating film 22 in the present embodiment. As a semiconductor material which constitutes the semiconductor layer 30, any suitable materials may be used. For example, the semiconductor layer may be made of silicon (e.g. Si) and germanium (Ge) or an oxide. The oxide of an oxide semiconductor may be an oxide of an elementary substance such as ZnO, $SnO_2$, $In_2O_3$, $TiO_2$, or a composite oxide such as InGaZnO, InSnO, InZnO, ZnMgO. As needed, a compound semiconductor may also be used, in which case a compound thereof is for example GaN, SiC, ZnSe, CdS, GaAs and so forth. Furthermore, an organic semiconductor may also be used, in which case an organic thereof is for example pentacene, poly-3-hexyl-thiophene, porphyrin derivatives, copper phthalocyanine, C60 and so forth. The semiconductor layer 30 after being formed has a thickness ranging from preferably about 10 nm to about 150 nm, more preferably about 20 nm to about 80 nm.

The surface metal oxide film 20 is a covering film consisting of a metal oxide which is provided in the surface area of the metal layer 10. More specifically, the surface metal oxide film 20 is the metal oxide film made from "the metal which constitutes the metal layer 10". The kind of the metal oxide film is not particularly limited. The metal oxide film may be any suitable films as long as each of them is a film obtained by oxidizing the surface of the metal layer 10. For example, in a case where the metal layer 10 is made of aluminum, the surface metal oxide film 20 may be an anodic oxide film made from the aluminum (the anodic oxide film serving as a covering film of the metal layer). An anodic oxidation for obtaining the anodic oxide film can be easily carried out by using various chemical conversion solutions, and as a result, a covering film of the densified oxide with its very small thickness is formed. In the meanwhile, the term "oxide film" as used in the present description may be referred to as "oxide covering film" or "oxide coating" in the light of the actual embodiment thereof. In addition, the term "densified" used in the expression "covering film of the densified oxide" substantially means that the oxide film has no defect or the reduced degree of the defect.

In the flexible semiconductor device 100, a part of the surface metal oxide film 20, which part is sandwiched between the gate electrode 12g and the semiconductor layer 30 serves as a gate insulating film 22.

Here, a drain current in the saturation region of a transistor can be generally represented by the following Formula 1:

$$I = C1 \times (W/L) \times (\in/d) \times (Vg - C2)^2 \quad \text{[Formula 1]}$$

where "I" is a drain current in a saturation region of a transistor, "C1" and "C2" each is a constant, "W" is a channel width, "L" is a channel length, "∈" is a specific inductive, "d" is a thickness of a gate insulating film and "Vg" is a gate voltage. According to Formula 1, it is understood that a larger drain current is produced with a smaller gate voltage when the gate insulating film has a larger specific inductive and a smaller thickness, and thus such a case is preferable.

In this regard, the present invention can use the densified oxide film 20 with a relatively large specific inductive (i.e. the value thereof may be about 10 in the case of the anodic oxide film made from the aluminum) and very thin thickness as the gate insulating film 22. Thus, there is provided a semiconductor device by which a relatively large drain current is obtained with a relatively small gate voltage. Namely, the flexible semiconductor device 100 of the present invention may have excellent TFT characteristics due to the surface metal oxide film 20 thereof.

With regard to the thickness of the surface metal oxide film 20, it is preferable to make the thickness as thin as possible from the viewpoint of reducing the gate voltage. Therefore, the surface metal oxide film 20 preferably has a thickness of about 3 μm or less, more preferably about 800 nm or less, and still more preferably about 200 nm or less. On the other hand, it is not preferable that the surface metal oxide film 20 has an extremely thin thickness from the viewpoint of maintaining the insulation property. Accordingly, the lower limit of the thickness of the surface metal oxide is about 100 nm, provided that the maximum gate voltage is 40V in the case where the surface metal oxide is the anodic oxide film made from the aluminum (it should be noted that the lower limit of the thickness of the surface metal oxide film 20 may be changed depending on the applied gate voltage and the breakdown voltage characteristic of the oxide film.

In the surface area of the metal layer 10 of the flexible semiconductor device 100, one or more uncovered portions 40, which are not covered with the surface metal oxide film 20, are locally or partially formed. In other words, although most surface area of the metal layer 10 is covered with the metal oxide film 20, the surface of the metal layer 10 has one or more uncovered portions 40 where the underlying metal (i.e. aluminum according to one embodiment of the present invention) is exposed without being covered with the surface metal oxide film 20. The uncovered portions 40 contribute to an electrical interconnection between the electrode and the semiconductor layer. Specifically, each of the source electrodes 12s and the drain electrodes 12d is electrically connected with the semiconductor layer 30 via the uncovered portions 40. For this reason, the uncovered portion 40 functions as an interlayer connecting portion (i.e. conductive via) in the surface metal oxide film 20.

Seen from the illustrated embodiment in Figures, the uncovered portion 40 can correspond to "non-oxidized portion" which is obtained by allowing a part of the surface of the metal layer 10 to remain non-oxidized. Namely, the manufacturing method of the present invention is characterized in that the non-oxidized portion 40 is formed in the surface of the metal foil 10 by partially non-oxidizing the area of the surface of the metal foil 10, and that the non-oxidized portion 40 is used as a via which electrically interconnects between the metal foil 10 and the semiconductor layer 30. That is, the non-oxidized portion 40 is used as an interlayer connecting portion (i.e. via), which leads to a simplified realization of the interlayer connection without a complicated structure of the flexible semiconductor device.

As shown in Figures, the flexible semiconductor device 100 may have the extraction electrodes 50s and 50d. Examples of the metal constituent of the extraction electrodes 50s and 50d may include a metal such as gold (Au), silver (Ag), copper (Cu), nickel (Ni), chromium (Cr), cobalt (Co), magnesium (Mg), calcium (Ca), platinum (Pt), molybdenum (Mo), iron (Fe), zinc (Zn), titanium (Ti) and tungsten (W), and an electrically conductive oxides such as tin oxide ($SnO_2$), indium tin oxide (ITO), fluorine containing tin oxide (FTO), ruthenium oxide ($RuO_2$), iridium oxide ($IrO_2$) and platinum oxide ($PtO_2$). A silver paste (i.e. Ag paste) may be used from the view point that a minute pattern of the extraction electrodes is easily achieved. Each of the extraction electrodes 50s and 50d is formed on the surface metal oxide film 20, and can serve to electrically interconnect between the non-oxidized portion 40 and the semiconductor layer 30. Each of the patterns of the extraction electrode 50s and 50d has a thickness ranging from about 50 nm to about 5 μm, preferably from about 80 nm to about 1 μm. The extraction electrodes 50s and 50d can serve to shorten the channel length (i.e. the substantial distance between the source and the drain). As a result, a high speed and a reduction of the gate voltage is achieved due to the shortening of the channel length (see Formula 1). It should be noted that the flexible semiconductor device 100 can be operated even when extraction electrodes 50s and 50d are not provided so long as the semiconductor layer 30 directly contacts with the non-oxidized portion 40.

On the surface metal oxide film 20, there is formed a resin layer 60 with which the semiconductor layer 30 is covered. The resin layer 60 is a support substrate for supporting the TFT elements and is made of a thermoplastic resin material or a thermosetting resin material having flexibility characteristic after being cured. Examples of the resin material for the resin layer may include an epoxy resin, a polyimide (PI) resin, an acrylic resin, a polyethylene terephthalate (PET) resin, a polyethylene naphthalate (PEN) resin, a polyphenylene sulfide (PPS) resin, a polyphenylene ether (PPE) resin, a fluorine containing resin (e.g. PTFE) and composite materials thereof. These resin materials are excellent in the dimensional stability and thus is preferably used as a flexible material of the flexible semiconductor device 100. The resin layer 60 has a thickness ranging from preferably about 1 μm to about 7 μm, more preferably about 2 μm to about 5 μm.

Next, with reference to FIGS. 2(a) to 2(d) and FIGS. 3(a) to 3(c), the method of manufacturing the above-mentioned flexible semiconductor device 100 of the present invention will be explained. FIGS. 2(a) to 2(d) and FIGS. 3(a) to 3(c) are cross-sectional views illustrating the steps in a manufacturing process of the flexible semiconductor device 100.

Upon carrying out the manufacturing method of the present invention, the step (i) is firstly performed. That is, the metal foil 10 is provided as shown in FIG. 2(a). For example, a metal foil 10 made of aluminum is provided. As such metal foil 10, any of commercially available ones can be used. The metal foil 10 preferably has a thickness ranging from about 2 μm to about 100 μm, more preferably from about 4 μm to about 20 μm, still more preferably from about 8 μm to about 16 μm, for example, 12 μm.

Figure 2:
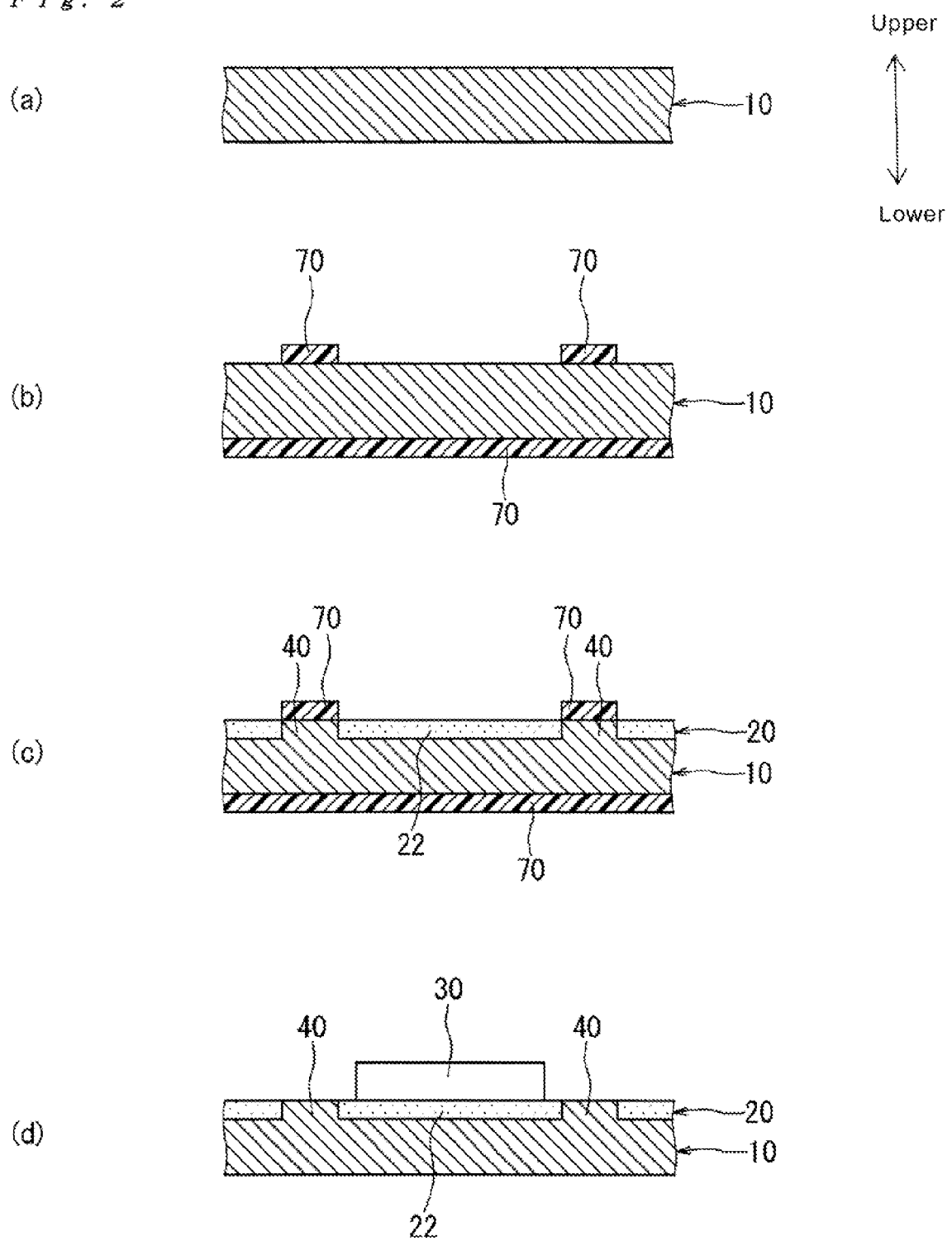
FIGS. 2(a) to 2(d) show cross-sectional views illustrating the steps in a manufacturing process of a flexible semiconductor device according to one embodiment of the present invention.

Next, resist 70 is provided on the surface of the metal foil 10 as shown in FIG. 2(b). Specifically, the resists 70 are provided in the predetermined areas at which non-oxidized portions will be formed (namely, the areas which are not intended to be subjected to an oxidation treatment). As illustrated in FIG. 2, one or more resist layers or patterns 70 are formed in the selected parts of the top surface of the metal foil 10 and the whole undersurface of the metal foil 10. It is sufficient that the resist 70 has a chemical resistance to an oxidation treatment liquid as will be described later. Examples of the material of the resist 70 may include a photosensitizing agent such as novolak resin and a diazonaphthoquinone (DNQ) based photosensitizing agent, as well as a material comprising solvents such as propylene glycol monomethyl acetate (PGMEA) and ethyl lactate (EL).

The steps for providing and removing the resist 70 may be suitably performed by utilizing a typical photolithography process. For example, it is desirable to use an organic solvent for removing the resist in the case where the metal foil is made of aluminum. The reason for this is that the aluminum tends to have a solubility with respect to a strong alkali.

After the provision of the resists 70 is completed, an oxidation treatment is performed as the step (ii). More specifically, the oxidation treatment is applied to the surface of the metal foil 10 with the resists 70 provided thereon. By performing the oxidation treatment, an oxide film 20 made from the metal constituent of the metal foil 10 is formed. Namely there is formed a surface metal oxide film. The oxide film 20 can be used as a gate insulating film 22. In a case where the metal foil 10 is made of a valve metal (e.g. aluminum), the oxidation of the metal foil surface is performed by an anodic oxidation of the valve metal.

The process of the anodic oxidation is not particularly limited. Any suitably chemical conversion solutions may be used for the anodic oxidation. For example, the anodic oxidation may be performed by immersing a cathode and the metal foil 10 which functions as the anode into a chemical conversion solution, and subsequently connecting both the cathode and the anode with a constant current source, and thereby applying a desired voltage thereto. As the chemical conversion solution of the anodic oxidation of the aluminum, a mixed solution of 30 wt % of aqueous tartaric acid (1 wt %) solution and 70 wt % of ethylene glycol, with an adjusted pH of around the neutral value by using of ammonia, may be used. As the cathode, a plate of stainless steel (e.g. SUS304) may be used. The performing of such anodic oxidation can stably produce an oxide film which is thin and excellent in the smoothness and thus is suitably used as the gate insulating film. In this regard, the thickness of the anodic oxide film is proportional to the voltage to be applied. Therefore, it is capable to suitably select the voltage to be applied according to the desired thickness of the film. Examples of current and voltage conditions of the anodic oxidation may include the current density ranging from about 1 to about 10 mA/cm$^2$ and the voltage ranging from about 50 to about 600 V. For example, the current density is about 5 mA/cm$^2$ and the voltage is about 100 V.

In the case where only one surface of the metal foil 10 is selectively subjected to the anodic oxidation, the other surface of the metal foil 10 is preliminarily coated with the resist 70, as described above. However, another process may be adopted where the only one surface of the metal foil 10 is selectively brought into contact with the chemical conversion solution. Specifically, after a cylindrical container is abutted against the metal foil 10 so that the metal foil 10 serves as a bottom plate and a sealing member is applied so as to prevent the leakage of a liquid phase content, a chemical conversion solution may be introduced into the cylindrical container. Thereafter, the metal foil 10 serving as the anode and the cathode (e.g. stainless steel plate) immersed in the chemical conversion solution are connected to a power source. As a result, the only one surface of the metal foil 10, which surface is in contact with the chemical conversion solution, can be selectively oxidized.

After the formation of the metal oxide film 20 is completed, the resist 70 is removed. As shown in FIG. 2(c), the existence of the metal foil 10 gives such a condition that some parts of the surface of the metal foil remains non-oxidized. After the resist 70 has been removed, the metal foil 10 comes to have its surface wherein some parts thereof are non-oxidized portions 40 where no metal oxide film 20 is provided. Namely, the uncovered portions where the underlying metal is exposed without being covered with the metal oxide film 20 are provided (see FIG. 2(d)).

Subsequent to the formation of the non-oxidized portions 40, a semiconductor layer is formed as the step (iii). Specifically, the semiconductor layer 30 is formed on the surface metal oxide film 20 (particularly, the semiconductor layer 30 is formed on a part of the oxide film, which part functions as the gate insulating film 22). The formation of such semiconductor layer 30 can be performed by depositing a semiconductor material. The deposition of the semiconductor material can be suitably performed by a thin film formation process such as a vacuum deposition process, a sputtering process and a plasma CVD process, as well as by a printing process such as a relief printing process, a gravure printing process, a screen printing process and an ink jet printing process.

For example, a silicon film is deposited to a desired position of the metal oxide film 20 made from the metal foil 10 heated up to a temperature of 350° C. by the plasma CVD process. Subsequently, the deposited silicon film is subjected to a thermal annealing treatment at a temperature of 600° C. in an inert atmosphere (typically non-oxidizing atmosphere), and thereby a polysilicon semiconductor layer is formed.

In this way, the semiconductor layer 30 can be formed by performing an elevated-temperature process since the metal foil 10 is used in the present invention. In other words, assuming that a substrate made of a resin (plastic) is used and a semiconductor layer is directly formed on the resin substrate, a process temperature must be restricted to be low due to a low heat-resistant property of the resin substrate. In contrast, according to the manufacturing method, the semiconductor layer 30 can be formed at the process temperature beyond the heat-resistant temperature of the resin layer 60 (i.e. elevated-temperature process) in spite of the use of the resin layer 60 having a low heat resistance as a substrate. For example, even when a PEN resin film (heat-resistant temperature thereof being 180° C.) is used, the elevated-temperature process exceeding 180° C. (preferably elevated-temperature process ranging from 300° C. to 1000° C., more preferably 400° C. to 1000° C.) is positively employed upon the formation of the semiconductor layer 30. In a case where an aluminum foil is used as the metal foil (particularly in the case of an aluminum foil, some parts of the surface region thereof have been anodically oxidized), it is capable to positively adopt an elevated-temperature process, for example preferably in the temperature range of from 300° C. to 600° C., more preferably from 400° C. to 540° C. Moreover, in another case where a stainless steel is used as the metal foil, it is capable to positively adopt an elevated-temperature process, for example, preferably in the temperature range of from 300° C. to 1000° C., more preferably from 400° C. to 800° C.

Namely, the step of forming the semiconductor layer can be carried out at a temperature of 180° C. or more, preferably through an elevated-temperature process ranging from approximately 300° C. to 1000° C., more preferably from approximately 400° C. to 1000° C. It is also capable to positively subject the obtained semiconductor layer to a heat treatment due to the fact that the metal foil is used.

For example, after the deposition of the semiconductor material on the gate insulating film 22, it is capable to subject the deposited semiconductor material to a heat treatment. The process of such heat treatment is not particularly limited. For example, the heat treatment may be a thermal annealing treatment (atmosphere heating) or a laser annealing treatment. The combination of the thermal annealing treatment and the laser annealing treatment may also be adopted. For example, after the semiconductor layer of an amorphous silicon is formed on the desired position on the gate insulating film 22, the semiconductor layer may be annealed by laser. By subjecting the semiconductor to such heat treatment, a crystallization of the semiconductor proceeds and thus properties of the semiconductor (e.g. carrier mobility) can be improved. For example, as for the carrier mobility of a silicon semiconductor, the value of 1 or less may be increased to a value of 100 or more by the above heat treatment. The term "annealing treatment" used in the present description substantially means a heat treatment which is intended to improve a mobility or a stabilization of the semiconductor's properties.

Specific embodiments regarding the formation of the semiconductor layer will be described below:

A solution containing a cyclic silane compound (for example, a toluene solution of cyclopentasilane) is applied onto a predetermined position of the gate insulating film 22 by an ink jet process or the like. Subsequently, the applied material is subjected to a heat treatment at a temperature of 300° C., and thereby a semiconductor layer made of amorphous silicon is formed. Thereafter, the semiconductor layer is subjected to a thermal annealing treatment at a temperature of 600° C. under a non-oxidizing atmosphere (typically under an inert gas atmosphere), and thereby a polysilicon film with a high carrier mobility is produced.

As another process for manufacturing the polysilicon film, a heat treatment for forming the semiconductor layer 30 of amorphous silicon is performed at a temperature of 540° C., and subsequently the semiconductor material is irradiated with an excimer laser having a wave length of 308 nm at an intensity of 450 mJ/cm$^2$, and thereby a polysilicon film is produced.

As further another process for manufacturing the polysilicon film, there is proposed a process to use an amorphous oxide semiconductor. In this process, a semiconductor layer is obtained through a film formation by subjecting an oxide target having a composition of InGaZnO$_4$ to a magnetron sputtering process at a power of 50 W under a mixed atmosphere consisting of Ar and O$_2$ (Ar/(Ar+O$_2$) flow rate ratio equals to 0.024, the pressure is 0.5 Pa) and at a room temperature. It is preferable to subject the semiconductor layer of an oxide semiconductor to a heat treatment at a temperature of from 200° C. to 400° C. under the atmospheric air condition. The reason for this is that the oxygen defect of the oxide semiconductor can be restored by the heat treatment having a temperature condition of 300° C. or higher, and thus the semiconductor's properties (e.g. carrier mobility) can be improved.

Subsequent to the forming step of the semiconductor layer 30, extraction electrodes 50s and 50d are formed on the metal oxide film 20 so that the extraction electrodes 50s and 50d are brought into contact with each of the semiconductor layer 30 and the non-oxidized portion 40 (see FIG. 3 (a)). Due to the existence of the extraction electrodes 50s and 50d, the metal layer 10 is capable to electrically connect with the semiconductor layer 30 via the non-oxidized portion 40. In a case where Ag paste is used as a raw material of the extraction electrodes, a formation of the extraction electrodes 50s and 50d can be performed by printing the Ag paste (for example, by an ink jet printing).

Subsequently, as shown in FIG. 3 (b), the resin layer 60 is formed on the metal oxide film 20 so that the semiconductor layer 30 is covered with the resin layer. The process for forming the resin layer 60 is not particularly limited. For example, it is possible to adopt a process of laminating a semi-cured resin sheet onto the metal oxide film 20 and thereafter allowing the sheet to be cured (in such case, an adhesive material may be coated on the laminating surface of the resin sheet). Alternatively, it is also possible to adopt a process of applying a semi-cured resin onto the metal oxide film 20 by a spin-coating or the like and thereafter allowing the resin to be cured. Through such formation of the resin layer 60, it becomes capable to stably convey and handle of the device precursor while protecting the semiconductor layer 30 during a subsequent step (e.g. an etching process of the metal foil 10).

Subsequent to the formation of the resin layer 60, as shown in FIG. 3(c), a gate electrode 12g, a source electrode 12s and a drain electrode 12d are formed from the metal foil 10 by performing a selective etching of the metal foil 10 as the step (iv). The gate electrode 12g is formed such that it is located below the semiconductor layer 30 to oppose to the semiconductor layer 30 across the gate insulating film 22. As the etchant of the metal foil 10, any suitable materials may be used depending on the material of the metal foil 10. For example, in a case where the metal foil is made of aluminum, a mixed acid of phosphoric acid, acetic acid and nitric acid may be used as an etchant.

Through the above processes, the manufacturing of the flexible semiconductor device 100 is finally completed where the interlayer connection is achieved by the non-oxidized portion 40.

According to the manufacturing method of the present invention, the oxidizing of the surface of the metal foil 10 produces the gate insulating film 22 of the metal oxide film 20 made from the metal constituent of the metal foil 10. Subsequently, the semiconductor layer 30 is formed on the gate insulating film 22, and then the gate electrode 12g, the source electrode 12s and the drain electrode 12d are formed by partially etching away the metal foil 10. By oxidizing the surface of the metal foil 10 as in the manufacturing method of the present invention, it is capable to obtain the gate insulating film 22 with thin thickness and very densified property (i.e. excellent smoothness) therefrom and thus to improve the TFT performance. In addition, in spite of the use of the resin layer 60 having the low heat-resistant property as a support substrate, the semiconductor layer 30 can be positively subjected to the heat treatment, and consequently the semiconductor properties (e.g. carrier mobility) are improved.

Moreover, according to the manufacturing method of the present invention, the non-oxidized portions 40 are formed in the surface area of the metal foil 10 by allowing parts of the surface of the metal layer 10 to remain non-oxidized, and the non-oxidized portions 40 serve as the vias through which the electrodes and the semiconductor layer 30 are electrically interconnected. Thus, the use of the non-oxidized portion 40 as a via (i.e. interlayer connecting portion) can easily achieve an interlayer connection without an complicated structure of the flexible semiconductor device. Furthermore, it is capable to eliminate a processing for removing the densified and chemically stable metal oxide film 20 (for example, hole processing by laser for the purpose of the interlayer connecting). That is, according to the present invention, it is not necessary to remove some parts of the insulating layer after being formed. Therefore, the present invention produces less waste material and less waste energy, which leads to a high productivity of the manufacturing of the flexible semiconductor device. That is, according to the manufacturing method of the present invention, the flexible semiconductor device 100 having an outstanding TFT performance can be simply and easily obtained with sufficient productivity.

Although the metal foil 10 made of the valve metal (e.g. aluminum) has been exemplified above, the metal constituent of the metal foil 10 is not particularly limited. Any suitable metals other than the valve metal may be used for the metal constituent of the metal foil 10, as long as the metal constituent contributes to uniformly cover the surface of the metal with the resulting oxide film or oxide coating thereof. In such case, it is capable to adopt a thermal oxidation (e.g. surface oxidation by heating) or a chemical oxidation (e.g. surface oxidation by using of an oxidizing agent) as the oxidation process of the metal foil 10 in place of the anodic oxidation.

Figure 4:
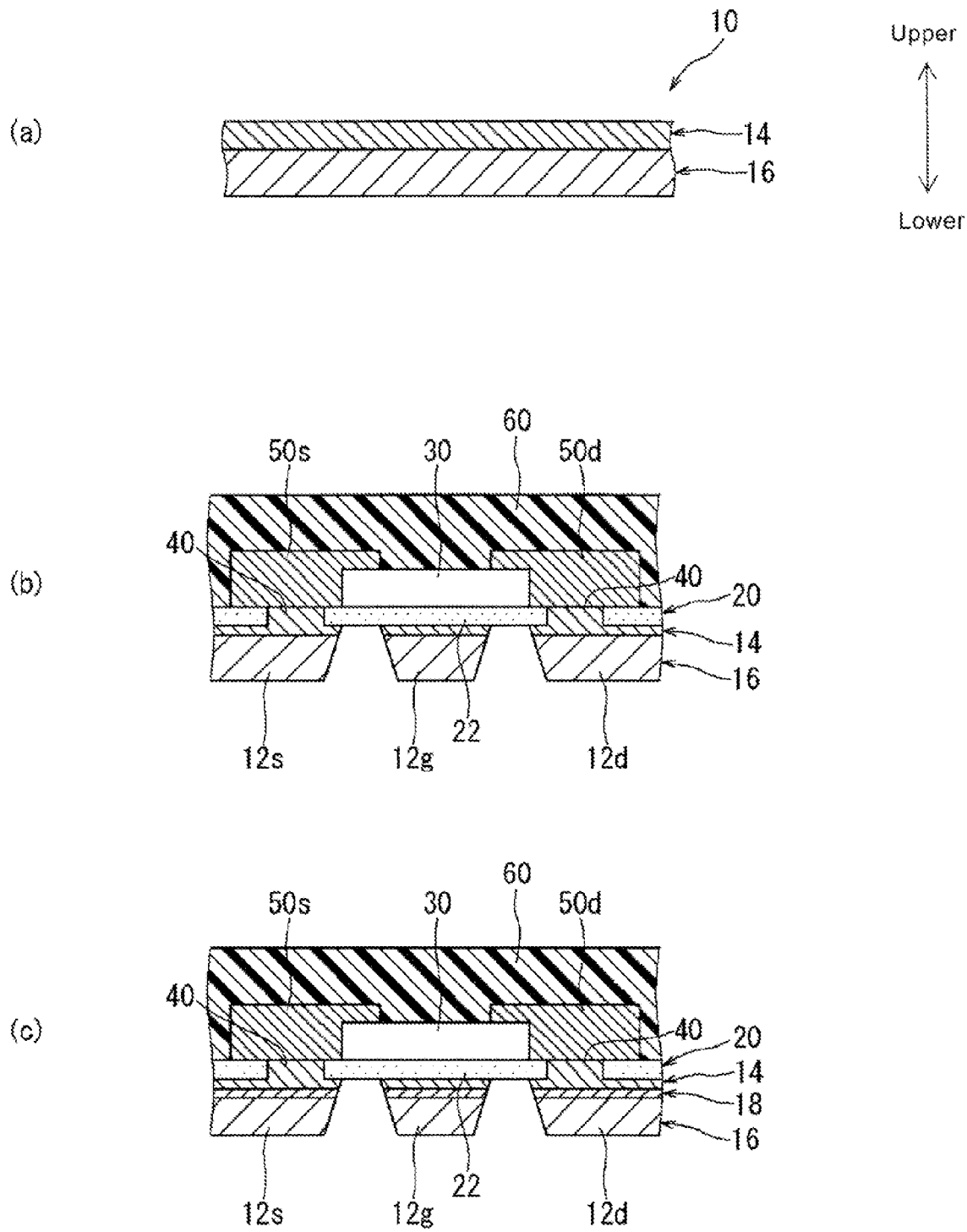
FIG. 4(a) shows a cross sectional view of the metal layers (multilayer structure) according to one embodiment of the present invention.
FIG. 4(b) shows a cross sectional view of the flexible semiconductor device according to one embodiment of the present invention.
FIG. 4(c) shows a cross sectional view of the flexible semiconductor device according to one embodiment of the present invention.

Moreover, the metal foil 10 may be a single metal layer or may be a laminate composed of two or more metal layers. For example, as shown in FIG. 4(a), the metal foil 10 may be a laminate composed of a first metal layer 14 made of a valve metal and a second metal layer 16 made of a metal other than the valve metal. The first metal layer 14 is, for example, a tantalum layer (thickness thereof being preferably in the range of from about 0.1 μm to about 1.0 μm, for example about 0.3 μm). The second metal layer 16 is a copper layer (thickness thereof being preferably in the range of from about 1 μm to about 99.9 μm, more preferably from about 3 μm to about 19.9 μm, still more preferably from about 7 μm to about 15.9 μm, for example, about 11.7 μm). Even in such a case, the first metal layer 14 can be subjected to the local (or selective) oxidation treatment, and thereby the resulting non-oxidized portion 40 of the first metal layer 14 can be preferably used as the vias (i.e. interlayer connecting portions) as shown in FIG. 4(b). In this regard, a multilayered structure as shown in FIG. 4(a) can be formed by performing a thin film forming process. For example, in a case where the first metal layer 14 is a tantalum layer and the second metal layer 16 is a copper layer, a metal foil with a two-layered structure can be obtained by applying the tantalum layer over the copper plate through a suitable thin film forming process (e.g. a sputtering process).

Moreover, in a case where the first metal layer 14 is made of aluminum and the second metal layer 16 is made of copper, it is preferred that an interlayer 18 is provided between the first metal layer 14 and the second metal layer 16, as shown in FIG. 4(c). As the interlayer 18, it is preferable to use a layer which, does not form a solid solution with each metal of the first metal layer and the second metal layer and contains a metal with a high melting point (e.g. tungsten) or a covalently-bound compound (e.g. tantalum nitride). Such interlayer 18 functions as "a diffusion preventing layer (namely, a barrier layer)" which serves to prevent the copper constituent of the second metal layer 16 from diffusing into the first metal (aluminum) layer 14. The interlayer preferably has a thickness ranging from about 20 nm to about 180 nm, for example about 100 nm. Although FIGS. 4(b) and (c) illustrate a case where the thickness of the metal oxide film 20 is smaller than that of the first metal layer 14, it is possible that the thickness of the metal oxide film 20 is approximately the same as that of the first metal layer. In this case, the first metal layer 14 may be subjected to the oxidation treatment so that the whole thickness of the layer 14 is oxidized to form the surface metal oxide film 20 therefrom.

In the present invention, contact portions 35 may be formed at contacting regions among the semiconductor layer 30 and each of the extraction electrodes 50s and 50d as shown in FIGS. 5(a) and (b) if necessary. The predetermined region of the semiconductor layer 30 is doped with boron, and thereby the contact portions 35 can be formed. The contact portions 35 can offer advantage of a facilitated charge injection from a source electrode to a channel part.

Figure 6:
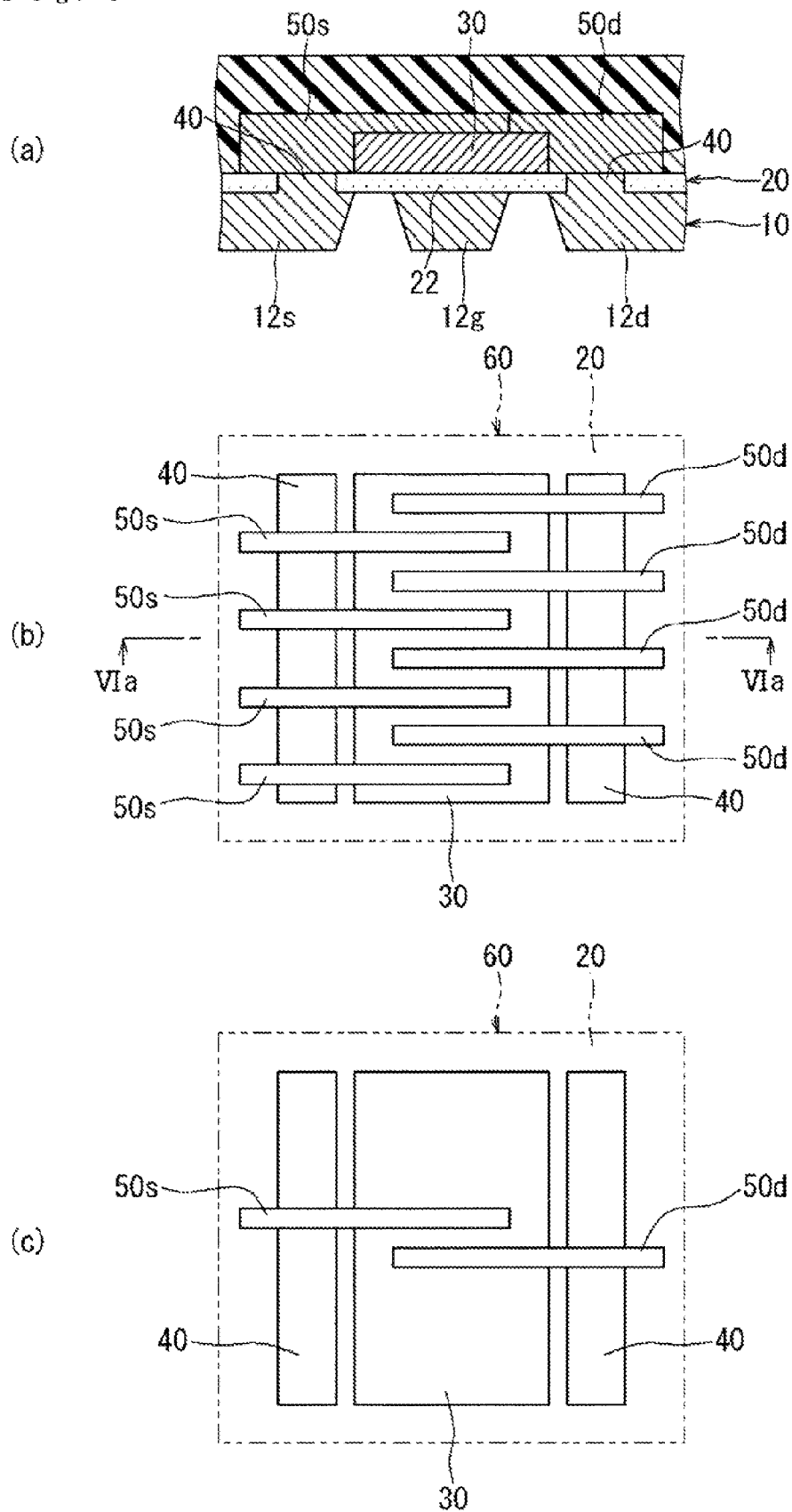
FIG. 6(a) shows a cross sectional view taken along line VIa-VIa of FIG. 6(b).
FIG. 6(b) shows a top plan view of the flexible semiconductor device according to one embodiment of the present invention.
FIG. 6(c) shows a top plan view of the flexible semiconductor device according to one embodiment of the present invention.

As shown in FIGS. 6(a) and (b), two or more sets of the extraction electrodes 50s and 50d may be formed. In the embodiment shown in FIG. 6(b), two or more extraction electrodes 50s are arranged to have a comb tooth shape, and two or more extraction electrodes 50d are arranged to have another comb tooth shape which opposes to the former comb tooth shape. The arranging of two or more extraction electrodes 50s and 50d in the shape of a comb tooth shape makes it possible to enlarge the channel width ("W" in Formula 1) while maintaining the area of the transistor element. This means that the amount of extractable current can be increased (see Formula 1). As shown in FIG. 6(c), it is also possible to reduce the number of comb teeth to one, if needed. Furthermore, the length of the comb tooth may be suitably determined according to the desired TFT performance. For example, in a case where a TFT array for an organic electroluminescence display is formed, it is capable to make the length of the comb teeth of a driving TFT array longer than that of the comb teeth of a switching TFT array.

Figure 7:
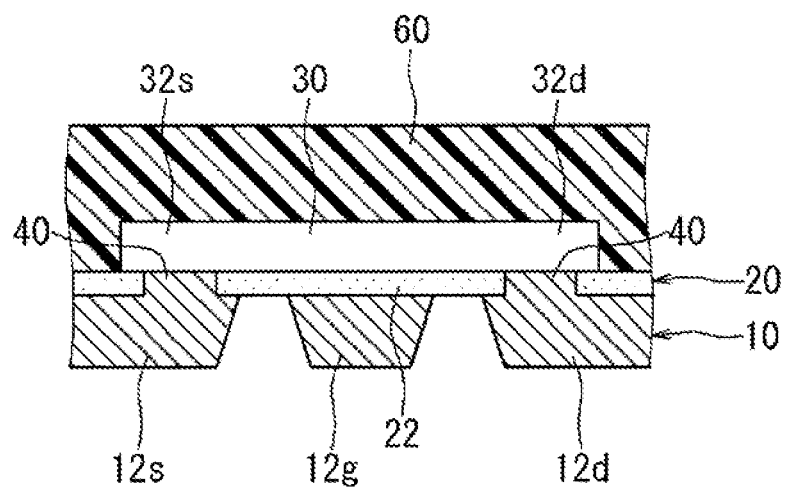
FIG. 7 shows a cross sectional view of the flexible semiconductor device according to one embodiment of the present invention.

In the present invention, as shown in FIG. 7, it is capable to adopt a configuration wherein neither of extraction electrodes 50s and 50d is formed. In this case, the semiconductor layer 30 and the non-oxidized portion 40 may be formed so that the semiconductor layer 30 is in a direct contact with the non-oxidized portion 40. Even in such configuration, it is capable to operate the flexible semiconductor device 100. In the illustrated configuration, the semiconductor layer 30 has extended parts 32s and 32d, both of which are in contact with the non-oxidized portions 40, respectively. Such configuration can eliminate the step of forming the extraction electrodes 50s and 50d, which leads to an achievement of a more simplified production of the flexible semiconductor device 100. In addition, it is capable that any suitable material such as tungstic oxide or molybdenum oxide and so on is interposed between the non-oxidized portion 40 and the semiconductor layer 30 in order to facilitate a charge injection.

Now, with reference to FIGS. 8(a) and (b), an embodiment wherein the flexible semiconductor device of the present embodiment is mounted on an image display device will be explained. FIG. 8(a) schematically shows a cross sectional view of a flexible semiconductor device 200 that is to be mounted on an image display device (for example, an organic EL display). The present flexible semiconductor device 200 comprises two or more transistor structures, each of which is composed of the semiconductor layer 30, the gate insulating film 22, the gate electrode 12g, the source electrode 12s and the drain electrode 12d.

In the example shown in FIG. 8(a), there are two transistor structures composed of a switching transistor structure 200A (hereinafter, referred to as "Sw-Tr") and a driving transistor structure 200B (hereinafter, referred to as "Dr-Tr"). As shown therein, the flexible semiconductor device 200 has a stacked layer structure wherein Dr-Tr 200B is stacked on Sw-Tr 200A. On the surface of the metal layer 10A of Sw-Tr 200A, there are formed the non-oxidized portions 44 and 46 which are not covered with the metal oxide film 20A. The non-oxidized portion 44 electrically interconnects between the drain electrode 12Ad of Sw-Tr 200A and the gate electrode 12Bg of Dr-Tr 200B. While on the other hand, the non-oxidized portion 46 electrically interconnects between the drain electrode 12Bd of Dr-Tr 200B and the metal layer 10A of Sw-Tr 200A.

The flexible semiconductor device 200 is equipped with a capacitor 80. That is, as shown in FIG. 8(b), each pixel of the image display device is composed of a combination of two transistor structures 200A, 200B and one capacitor 80. The gate electrode 12Ag of Sw-Tr 200A is connected to a selection line 94. Among the source electrode 12As and the drain electrode 12Ad, one is connected to a data line 92 and the other is connected to the gate electrode 12Bg of Dr-Tr 200B. Among the source electrode 12Bs and the drain electrode 12Bd of Dr-Tr 200B, one is connected to a power source line 96 and the other is connected to the image display region (i.e. the organic EL device in the case of the illustrated embodiment). Moreover, the capacitor 80 is connected between the source electrode 12Bs and the gate electrode 12Bg of Dr-Tr 200B.

As for the above pixel circuit, when the switch of Sw-Tr 200A is set "ON" during the activation of the selection line 94, a driving voltage is supplied from the data line 92 and selected by Sw-Tr 200A, and then electrical charge is stored in the capacitor 80. Then, a voltage differential generated by the capacitor is applied to the gate electrode 12Bg of Dr-Tr 200B, a drain current corresponding to the voltage differential is supplied to the display region, and thereby allowing the organic EL device to emit light.

In a TFT element for driving the display device, which is one of the important applications of the flexible semiconductor device, a capacitor with its capacity for driving the element is required. According to the present invention, it is not necessary to arrange a capacitor separately in the exterior of the flexible semiconductor device 200 by directly incorporating the capacitor 80 into the flexible semiconductor device. As a result, there is realized an image display device which is a small in size and suitable for a high-density mounting.

As shown in FIG. 8, a lower electrode layer 82 of the capacitor 80 is located on the plane which is flush with the plane containing the gate electrode 12Ag, the source electrode 12As and the drain electrode 12Ad of Sw-Tr 200A, and each of them has been formed of the same metal layer i.e. metal layer 10A. Namely, the lower electrode layer 82, the gate electrode 12Ag, the source electrode 12As and the drain electrode 12Ad are flush with each other. Similarly, a dielectric layer 84 of the capacitor 80 is located on the plane flush with the plane containing the gate insulating film 22A of Sw-Tr 200A, and each of them has been formed from the same metal layer i.e. metal layer 20A. Namely, the dielectric layer 84 and the gate insulating film 22A are flush with each other. In this way, it is capable to form a capacitor 80 from the metal layer 10A and the metal oxide film 20A by arranging the capacitor 80 and the transistor structure 200A in parallel with each other, which leads to an achievement of a more simplified production of the flexible semiconductor device 200. Specifically, the dielectric layer 84 can be formed together with the formation of the gate insulating film 22A, and also the lower electrode layer 82 can be formed together with the formation of the gate electrode 12Ag, the source electrode 12As and the drain electrode 12Ad. Moreover, it is also possible to form an upper electrode layer 86 of the capacitor 80 from the same layer as that of the extraction electrodes 50As and 50Ad and in the same process as that of the extraction electrodes 50As and 50Ad.

FIG. 8(b) shows the drive circuit (equivalent circuit) 90 of the structure shown in FIG. 8(a). In this regard, a wiring 92 is a data line, a wiring 94 is a selection line and a wiring 96 is a power source line. The flexible semiconductor device 200 is provided in every pixel of each image display device. Each pixel may comprise not only two TFT elements but also more than three elements depending on the constructional design of the display, and thus the flexible semiconductor device 200 of the present embodiment may be modified according to such constructional design.

With reference to FIG. 9, the flexible semiconductor device 300 of another embodiment of the present invention will be explained. FIG. 9(a) is a plan view of the flexible semiconductor device 300 seen from the side of the metal layer 10. FIG. 9(b) is a cross sectional view taken along line IXb-IXb of FIG. 9(a). FIG. 9(c) is a cross sectional view taken along line IXc-IXc of FIG. 9(a).

In the present invention, as shown in FIGS. 9(a) to 9(c), the flexible semiconductor device 300 may have a single layered structure. In the flexible semiconductor device 300, the transistor structures 300A, 300B which constitute the drive circuit, and the capacitor 80 are formed from the same material, and each of them is located on the same plane.

For example, it is preferred that parts of the metal oxide film 20 are formed in a continuous arrangement over the region that contains the transistor structures 300A, 300B which constitute a drive circuit and the capacitor 80 as illustrated. More specifically, as shown in FIGS. 9(a) to 9(c), it is preferred that the metal oxide film 20 is formed over the substantially entire region containing Sw-Tr 300A, Dr-Tr 300B and the capacitor 80. That is, the expression "formed in a continuous arrangement" used herein means that each of Sw-Tr 300A, Dr-Tr 300B and the capacitor 80 does not respectively have a separated insulating layers, but has a common insulating layer which is interconnected with each other. In other words, as for the constructional design of the flexible semiconductor device 300, the gate insulating films 22A, 22B of the transistor structures 300A, 300B and the dielectric layer 84 of the capacitor 80 are located on the same plane, and each of them is formed from the same metal oxide film. Due to such constructional design of the present invention, the gate insulating films 22A, 22B and the dielectric layer 84 can be formed in the same process.

In an actual image display device, the combination of the transistor structure and the capacitor shown in FIGS. 9(*a*) to 9(*c*) is arranged in the form of an array corresponding to each pixel. It is preferred that the metal oxide film 20 is formed in a continuous arrangement over the region that contains the plurality of transistor structures and the capacitors. According to such configuration, each gate insulating film of each of the plurality of transistor structures and each of the capacitors are located on the same plane, and each of them is formed from the same metal oxide film. Thus, it is possible to form them in the same process at one time through one oxidation treatment of the metal layer 10.

According to the present invention, "interlayer connection" can be easily by partially and selectively forming the non-oxidized portion 40 in the surface oxide film, as described above. In particular, in a case of an image display device for a large scale display, the number of the transistor structures and capacitors is increased. Therefore, the improvement of the productivity resulted from the above "interlayer connection" becomes more remarkable. Moreover, the present invention can eliminate a processing for removing the metal oxide film 20 which is densified and chemically stable (for example, a laser hole processing for forming the interlayer connection), and thus a wasting of the materials and the energy can be omitted. It is therefore possible to increase a merit of the present invention in that the amount of the wasted materials and energy can be reduced, in the case where the flexible semiconductor device is used for a large image display device.

Even in the case of the flexible semiconductor device 200 having a multilayered structure as shown in FIG. 8(*a*), a plurality of transistor structures are arranged in the form of an array corresponding to each pixel. Therefore, when parts of a metal oxide film 20 are formed in a continuous arrangement over at least two adjacent transistor structures, the same effect as that described above will be provided similarly.

In FIGS. 9(*a*) to 9(*c*), a wiring 92 is a data line, a wiring 94 is a selection line and a wiring 96 is a power source line. Each of the wiring layers 92, 94 and 96 is located on the same plane containing the gate electrode, the source electrode and the drain electrode of the transistor structure to which these wirings are connected, and also is formed of the same metal layer 10. Due to such constructional design, each of the wiring layers 92, 94, 96 and the gate, source and drain electrodes of the transistor structures can be formed in the same process, which leads to an achievement of a more simplified production of the flexible semiconductor device 300 and the image display device.

Figure 10:
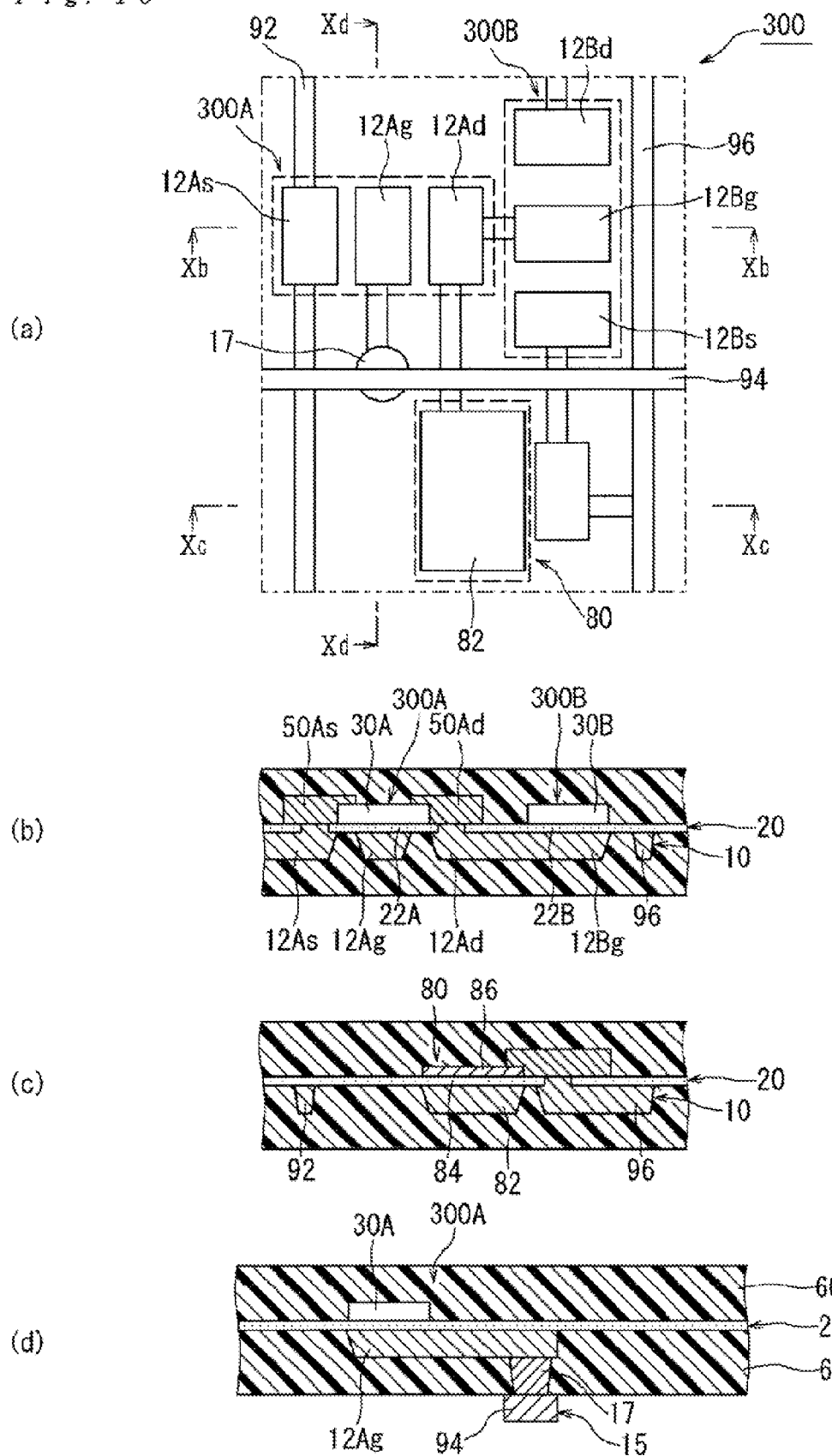
FIG. 10(a) shows a plan view of the flexible semiconductor device in one embodiment of the present invention, which is seen from the metal layer side thereof.
FIG. 10(b) shows a cross sectional view taken along line Xb-Xb of FIG. 10(a).
FIG. 10(c) shows a cross sectional view taken along line Xc-Xc of FIG. 10(a).
FIG. 10(d) shows a cross sectional view taken along line Xd-Xd of FIG. 10(a).

The constructional design of the present invention is not necessarily limited to the above. Any of parts of the metallic wiring layers 92, 94 and 96 may be formed in a plane which is different from the plane containing the electrodes 12Ag, 12As, 12Ad, 12Bg, 12Bs and 12Bd of the transistor structures 300A and 300B. For example, as shown in FIGS. 10(*a*) and (*d*), the wiring of the selection line 94 may be formed on the undersurface of the resin layer 60. In this case, the wiring of the selection line 94 can be formed from a metal layer 15 which is different from the metal layer 10 of the transistor structures 300A and 300B. In this regard, the wiring of the selection line 94 is electrically connected to the metal layer 10 (the gate electrode 12Ag of Sw-Tr 300A) through the via 17 that has been formed in the resin layer 60. Such configuration is preferable since the more wirings can be accommodated in the same area of the element, due to the fact that the wiring can be formed in the three dimensional array. That is, when the same number of wirings is used, a thick wiring with a larger cross section area can be used. As a result, it is capable to prevent or reduce the voltage drop attributable to the wiring resistance and a production yield in the etching process for forming the wiring can also be improved:

Especially in the case of the image display device for a large scale display, the total wiring length becomes longer, so that the merit by adopting the above configuration (namely, the reduced voltage drop) can be increased. In addition, the number of a transistor structures and capacitors becomes huge in the image display device for a large scale display, and thus the more improved yield can be provided.

In place of the selection line 94, the data line 92 and/or the power source line 96 may be located in a layer different from the metal layer 10. Even in such case, the effect that is resulted from forming the wiring lines in the three dimensional array can be obtained similarly.

Incidentally, the via 17 formed in the resin layer 60 as shown in FIG. 10 is a paste via, for example. The paste via 17 can be formed, for example by laminating the resin sheets 60, followed by performing a hole forming processing at a desired position of the laminate and then filling the hole with an electrically conductive paste. As the electrically conductive paste, a mixture of "Ag powder" and "resin composition mainly consisting of an epoxy resin" can be used, for example. As the hole forming processing, a laser processing using a YAG laser or the like may be employed. In a case where the resin layer 60 is a photosensitive resin, the hole forming processing may be performed by exposure and development processes. Alternatively, in place of the paste via, a plating via may be formed. The plating via can be formed, for example by filling the hole with an electrically conductive material by a nonelectrolytic copper plating process or an electrolytic copper plating process.

Figure 11:
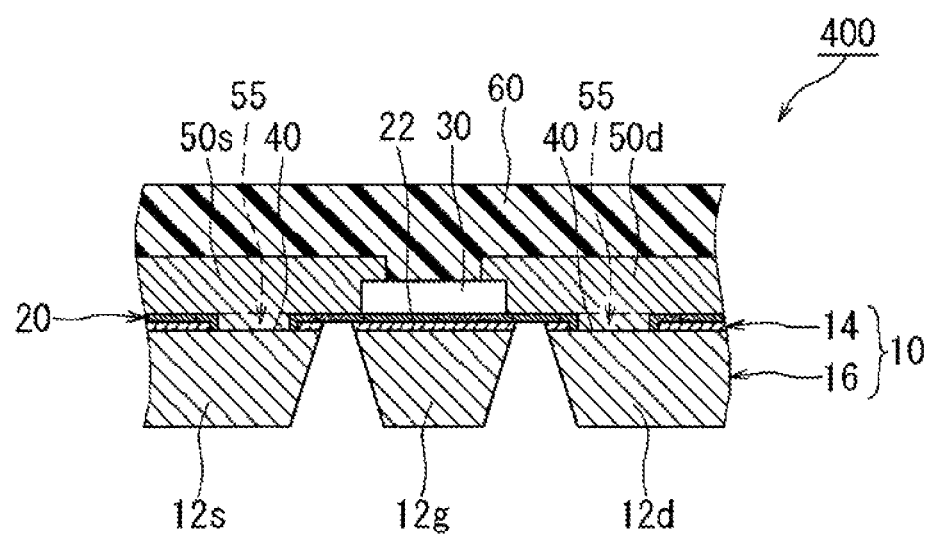
FIG. 11 shows a cross sectional view of the flexible semiconductor device according to one embodiment of the present invention.

In the embodiment shown in FIG. 1, the uncovered portions 40 which are not covered with the surface metal oxide film 20 (namely, the portions where the underlying metal is exposed therethrough) are ones obtained by not oxidizing parts of the surface of the metal layer 10. The present invention is not limited to such embodiment. For example, as shown in FIG. 11, an opening 55 may be formed in a part of the surface metal oxide film 20, and thereby the uncovered portion 40 where the underlying metal is exposed therethrough may be formed. Even in this case, each of the source electrode 12s and the drain electrode 12d can be electrically connected with the semiconductor layer 30 via the uncovered portion 40.

Figure 12:
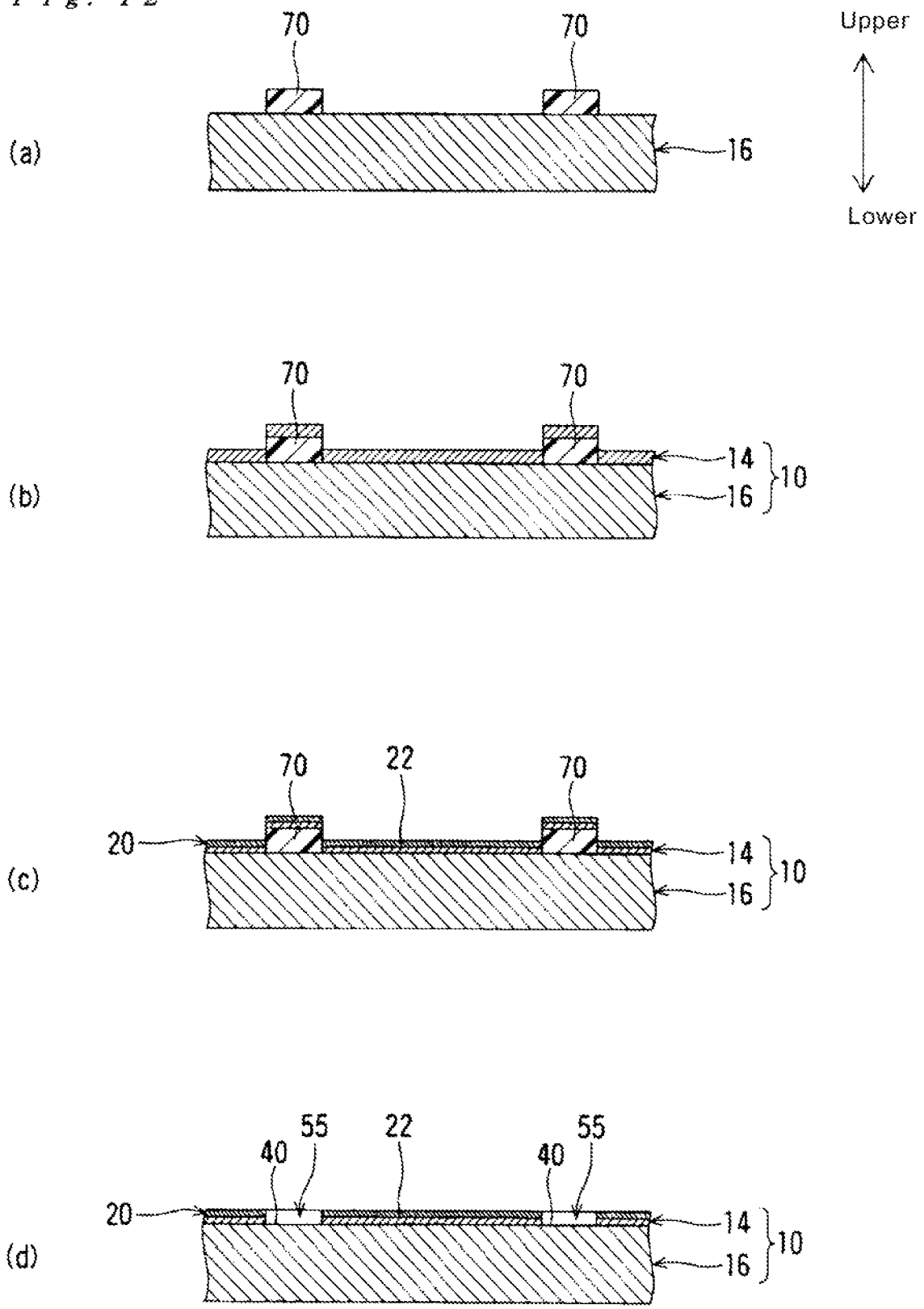
FIGS. 12(a) to 12(d) show cross-sectional views illustrating the steps in a manufacturing process of a flexible semiconductor device according to one embodiment of the present invention.

Next, an example of the manufacturing process of the flexible semiconductor device 400 shown in FIG. 11 will be explained. First, as shown in FIG. 12(*a*), a second metal layer (e.g. copper layer) 16 is provided and also resists 70 are provided on the predetermined positions of the second metal layer 16. Subsequently, as shown in FIG. 12(*b*), a first metal layer (e.g. aluminum layer) 14 is formed on the copper layer 16 with the resists 70 provided thereon. The aluminum layer can be formed, for example by a conventional thin film formation process. Thus, there is provided the metal layer 10 composed of the aluminum layer 14 and the copper layer 16 (the metal constituent of the layer 14 being different from that of the layer 16). If needed, an interlayer may be provided between the copper layer 16 and the aluminum layer 14.

After the formation of the metal layer 10 is completed, as shown in FIG. 12(c), the surface of the aluminum layer 14 is wholly oxidized, and thereby a metal oxide film 20 made from the aluminum of the aluminum layer 14 is produced. A part of such metal oxide film 20 functions as a gate insulating film 22 in the flexible semiconductor device 400.

After the formation of the metal oxide film 20 is completed, the resists 70 are removed as shown in FIG. 12(d). Upon removing the resists 70, parts of the aluminum layer 14 laminated on the resists 70 are also removed. As a result, openings 55 through which the underlying copper layer 16 is exposed are partially and selectively formed in the metal oxide film 20. The formation of the openings 55 result in the formation of the uncovered portions 40 which are not covered with the metal oxide film 20.

After the formation of the uncovered portions 40 is completed, the semiconductor layer 30 is formed on the gate insulating film 22 as shown in FIG. 13(a). Subsequently the extraction electrodes 50s and 50d are formed on the metal oxide film 20 as shown in FIG. 13(b). In this regard, the extraction electrodes 50s and 50d are formed so that each of them is in contact with the semiconductor layer 30 and the underlying copper layer 16 (i.e. uncovered portions 40) which is exposed at the opening 55. As a result, the copper layer 16 and the semiconductor layer 30 are electrically interconnected via the uncovered portions 40.

Then, as shown in FIG. 13(c), the resin layer 60 is formed over the metal oxide film 20, so that the resin layer 60 covers the semiconductor layer 30. Subsequently, as shown in FIG. 13(d), some parts of the copper layer 16 are partially and selectively etched away, and thereby the gate electrode 12g, the source electrode 12s and the drain electrode 12d are formed from the copper layer 16.

According to the above processes, the flexible semiconductor device 400 as shown in FIG. 11 can be finally obtained.

Figure 13:
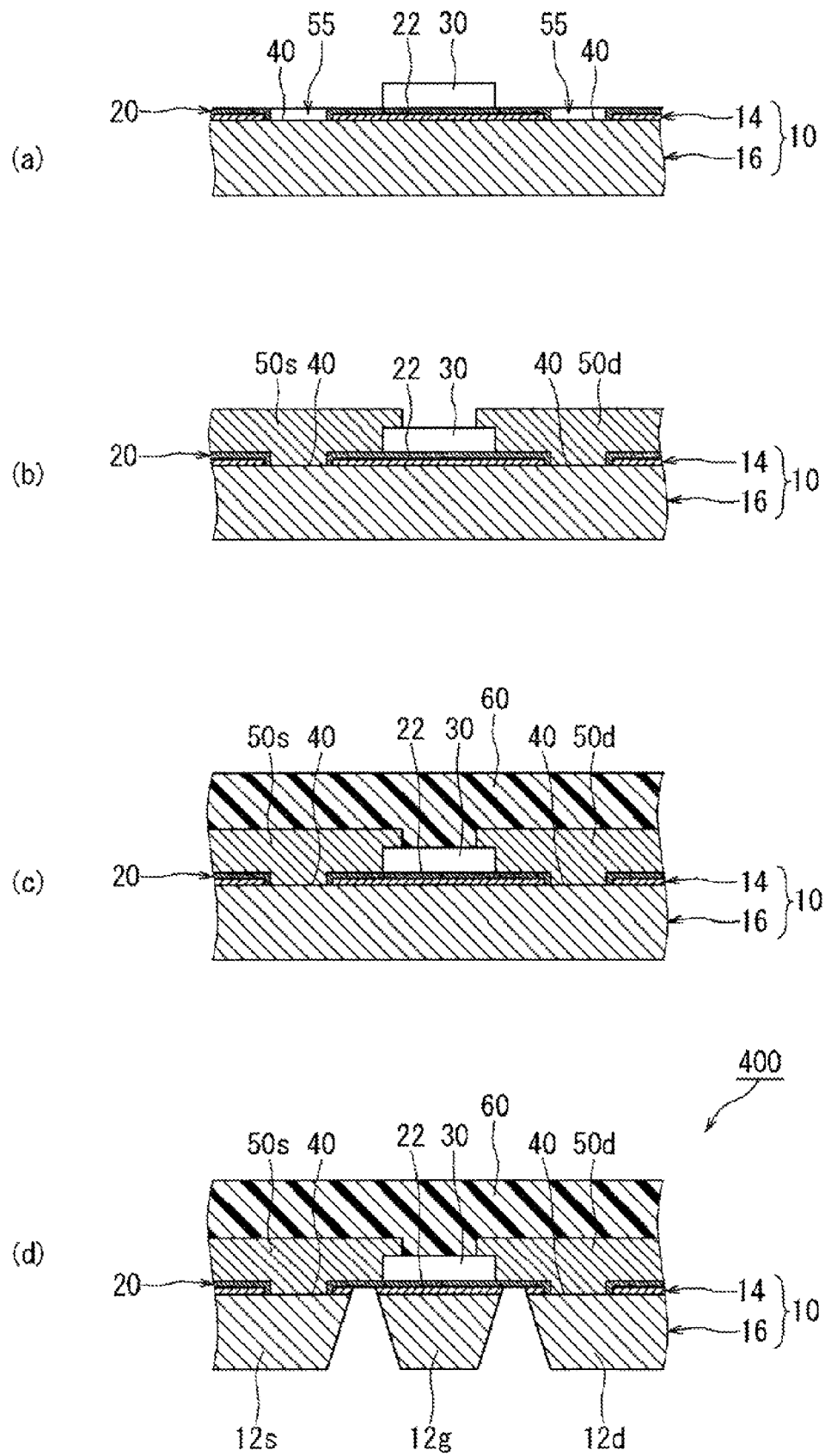
FIGS. 13(a) to 13(d) show cross-sectional views illustrating the steps in a manufacturing process of a flexible semiconductor device according to one embodiment of the present invention.
Figure 14:
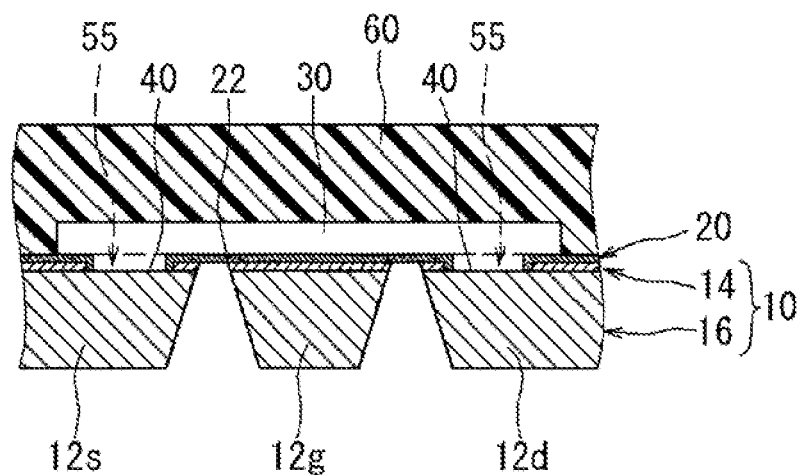
FIG. 14 shows a cross sectional view of the flexible semiconductor device according to one embodiment of the present invention.

According to the manufacturing method as shown in FIGS. 12 and 13, the second metal layer 16 made of copper can be exposed at the uncovered portions 40. Assuming that the first metal layer 14 made of aluminum is exposed at the uncovered portions 40, the aluminum tends to immediately form an oxide film therefrom upon being exposed to atmospheric air. Therefore, there is a possibility that the resistance at the interfaces with the extraction electrodes increases. In light of this, the present invention is advantageous in that the second metal layer 16 made of copper which is less easily oxidized than aluminum is exposed at the uncovered portions 40.

Even in the above case where "the uncovered portions where the underlying metal is exposed through the openings 55 are formed", the constructional design of the semiconductor device which does not have the extraction electrodes 50s and 50d can be adopted. In this regard, the semiconductor layer 30 is formed so that the semiconductor layer directly contacts with the underlying copper layer 16 which is exposed through the openings 55 (i.e. uncovered portions 40 of the underlying copper layer). As a result, the process of forming the extraction electrodes can be eliminated, which leads to achievement of a more simplified production of the flexible semiconductor device.

In general, the present invention as described above includes the following aspects:

The First Aspect:
A method for manufacturing a flexible semiconductor device with its flexibility comprising the steps of:
(i) providing a metal foil (≈metal layer);
(ii) locally oxidizing a surface region of the metal foil, and thereby forming a gate insulating film of a metal oxide film made from a metal constituent of the metal foil;
(iii) forming a semiconductor layer on the gate insulating film; and
(iv) etching away portions of the metal foil, and thereby forming a gate electrode, a source electrode and a drain electrode from the metal foil,
wherein, in the step (ii), at least one portion of the surface region of the metal foil is kept from being oxidized so that non-oxidized portion is formed in the surface region of the metal foil; and
wherein the semiconductor layer is electrically interconnected with each of the source electrode and the drain electrode via each of the non-oxidized portions.

The Second Aspect:
The method for manufacturing the flexible semiconductor device according to the first aspect, wherein the metal foil comprises a valve metal constituent; and
in the step (ii), the surface of the metal foil is anodically oxidized, and thereby forming a gate insulating film of the metal oxide film made from the valve metal constituent.

The Third Aspect:
The method for manufacturing the flexible semiconductor device according to the first or second aspect, wherein, in the step (ii), resist is provided on portions of the surface region of the metal foil, which portions are intended to form the non-oxidized portions, and subsequently an oxidation treatment is applied to the whole of the metal foil's surface region on which the resist is provided.

The Fourth Aspect:
The flexible semiconductor device according to any one of the first to third aspects, wherein, after the step (iii), an extraction electrode is formed on the metal oxide film such that the extraction electrode is in contact with both of the semiconductor layer and each of the non-oxidized portions.

The Fifth Aspect:
The method for manufacturing the flexible semiconductor device according to any one of the first to third aspects, wherein, in the step (iii), the semiconductor layer is formed such that the semiconductor layer is in direct contact with each of the non-oxidized portions.

The Sixth Aspect:
The method for manufacturing the flexible semiconductor device according to any one of the first to fifth aspects, wherein a heat treatment is applied to the semiconductor layer formed in the step (iii).

The Seventh Aspect:
The method for manufacturing the flexible semiconductor device according to the sixth aspect, wherein a thermal annealing treatment and/or a laser annealing treatment is performed as the heat treatment.

The Eighth Aspect:
The method for manufacturing the flexible semiconductor device according to any one of the first to seventh aspects, wherein, after the step (iii), a resin layer is formed over the metal oxide film such that the semiconductor layer is covered with the resin layer.

The Ninth Aspect:
The method for manufacturing the flexible semiconductor device according to any one of the first to eighth aspects, further comprising a step of forming a capacitor by using the metal foil and the metal oxide film,
wherein an etching is performed on the metal foil to form not only the electrodes but also an electrode layer of the capacitor; and
wherein not only a part of the metal oxide film is used as the gate insulating film, but also another part of the metal oxide film is used as a dielectric layer of the capacitor.

The Tenth Aspect:
The manufacturing method of the flexible semiconductor device according to any one of the first to ninth aspects, wherein the process for forming the semiconductor layer (i.e. the step (iii)) is performed as a high temperature process with a temperature ranging from 400° C. to 1000° C.

The Eleventh Aspect:

The manufacturing method of the flexible semiconductor device according to any one of the seventh to tenth aspects depending on the sixth aspect, wherein the step (iii) comprises:

depositing a semiconductor material onto the gate insulating film; and subjecting the deposited semiconductor material to a heat treatment.

The Twelfth Aspect:

The manufacturing method of the flexible semiconductor device according to any one of the first to eleventh aspects, wherein the metal foil is composed of a first metal layer and a second metal layer which are laminated to each other; and the first metal layer comprises a valve metal and the second metal layer comprises a metal other than the valve metal of the first metal layer.

The Thirteenth Aspect:

The manufacturing method of the flexible semiconductor device according to the twelfth aspect, wherein the first metal layer comprises aluminum and the second metal layer comprises copper.

The Fourteenth Aspect:

The manufacturing method of the flexible semiconductor device according to the twelfth or thirteenth aspect, wherein an interlayer is additionally formed between the first metal layer and the second metal layer.

The Fifteenth Aspect:

A flexible semiconductor device with its flexibility comprising:

a metal layer comprising a gate electrode, a source electrode and a drain electrode;

a metal oxide film made from a metal constituent of the metal layer and formed over a surface of the metal layer; and a semiconductor layer formed above the gate electrode via the metal oxide film, wherein uncovered portions, each of which is not covered with the metal oxide film, are locally formed in the surface region of the metal layer (especially surfaces of "source electrode" and "drain electrode"); and wherein the uncovered portions serve to electrically interconnect between the source electrode and the semiconductor layer and between the drain electrode and the semiconductor layer.

The Sixteenth Aspect:

The flexible semiconductor device according to the fifteenth aspect, wherein the metal layer is made of a valve metal; and the metal oxide film is an anodic oxide film made from the valve metal.

The Seventeenth Aspect:

The flexible semiconductor device according to the fifteenth or sixteenth aspect, wherein each of the gate electrode, the source electrode and the drain electrode has a tapered form in the direction of thickness thereof.

The Eighteenth Aspect:

The flexible semiconductor device according to any one of the fifteenth to seventeenth aspects, wherein each of the gate electrode, the source electrode and the drain electrode has a thickness ranging from 4 μm to about 20 μm.

The Nineteenth Aspect:

The flexible semiconductor device according to any one of the fifteenth to eighteenth aspects, wherein the metal layer comprises a first metal layer and a second metal layer which are laminated to each other;

the first metal layer comprises a valve metal, the second metal layer comprises a metal other than the valve metal of the first metal layer; and the metal oxide film is an anodic oxide film made from the valve metal.

The Twentieth Aspect:

The flexible semiconductor device according to the nineteenth aspect, wherein the first metal layer comprises aluminum and the second metal layer comprises copper.

The Twenty-First Aspect:

The flexible semiconductor device according to the nineteenth or twentieth aspect, wherein an interlayer is provided between the first metal layer and the second metal layer.

The Twenty-Second Aspect:

The flexible semiconductor device according to any one of the fifteenth to twenty-first aspects, wherein an extraction electrode, which electrically interconnects between the semiconductor layer and each of the uncovered portions, is formed on the metal oxide film.

The Twenty-Third Aspect:

The flexible semiconductor device according to any one of the fifteenth to twenty-second aspects, wherein a part of the metal oxide film, which part is sandwiched between the gate electrode and the semiconductor layer, serves as a gate insulating film.

The Twenty-Fourth Aspect:

The flexible semiconductor device according to any one of the fifteenth to twenty-third aspects, wherein a resin layer is formed over the metal oxide film so that the semiconductor layer is covered with the resin layer.

The Twenty-Fifth Aspect:

The flexible semiconductor device according to the twenty-fourth aspect depending on the twenty-third aspect, comprising a plurality of transistor structures, each of which comprises the semiconductor layer, the gate insulating film, the gate electrode, the source electrode and the drain electrode.

The Twenty-Sixth Aspect:

The flexible semiconductor device according to any one of the fifteenth to twenty-fifth aspects, further comprising a capacitor, wherein an electrode layer of the capacitor is made of the metal layer and a dielectric layer of the capacitor is made of the metal oxide film.

The Twenty-Seventh Aspect:

The flexible semiconductor device according to the twenty-sixth aspect depending on the twenty-fifth aspect, wherein the flexible semiconductor device is a semiconductor device used for an image display device, wherein a drive circuit of the image display device comprises the transistor structure and the capacitor of the flexible semiconductor device; and parts of the metal oxide film is formed in a continuous arrangement over the region that contains the transistor structure and the capacitor.

Although a few embodiments of the present invention have been hereinbefore described, the present invention is not limited to these embodiments. It will be readily appreciated by those skilled in the art that various modifications are possible without departing from the scope of the present invention. For example, the following modified embodiments are possible.

Each pixel may comprise not only two TFT elements (the first TFT element and the second TFT element) but also more than three elements depending on the constructional design of the display. As a result, the flexible semiconductor device of the present embodiment may be modified according to such constructional design.

In each of the above embodiments, although the present invention has been described with respect to the flexible semiconductor device which is mounted on an organic EL display, the flexible semiconductor device of the present invention may be mounted on an inorganic EL display. Moreover, the flexible semiconductor device may be mounted not only on the EL display but also on an electronic paper. Furthermore, it is possible that the flexible semiconductor device of the present invention is mounted not only on the display device but also on communication facilities (e.g. RFID), memories and so on.

The several embodiments wherein each one flexible semiconductor device is manufactured in the form corresponding to one device have been described above. While not being limited thereto, the present invention can be performed such that the flexible semiconductor devices are manufactured in the form corresponding to two or more devices. As an example of such manufacturing form, a roll-to-roll process may be adopted.

Figure 15:
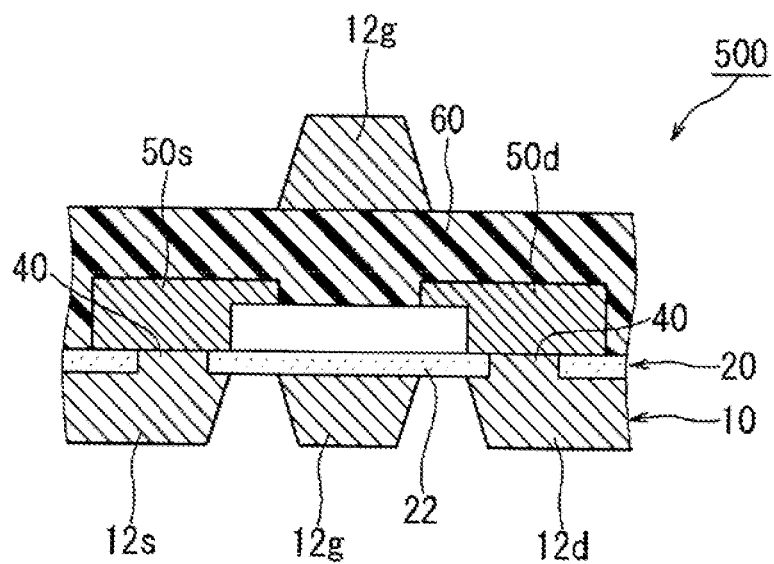
FIG. 15 shows a cross sectional view of the flexible semiconductor device according to one embodiment of the present invention.

In the flexible semiconductor device of the present invention, as shown in FIG. 15, another gate electrode may be further formed on the semiconductor layer. That is, the flexible semiconductor device may be a flexible semiconductor device 500 with a double gated structure. When the double gated structure is adopted, compared with the case where the number of the gate electrode is one, more electric current can be passed between the source electrode and the drain electrode. Moreover, even in the case where the same amount of electric current as that of the device with one gate electrode is supplied, it is capable to relatively reduce the amount of electric current flowing through a channel. As a result, the gate voltage can be decreased. In addition, two gate electrodes can be used independently, making it possible to change the threshold voltage of the semiconductor device, which leads to an achievement of a reduced variation in the semiconductor devices. Furthermore, another merit can be provided when one gate electrode is used for modulation purposes, in that different output size and/or frequency output can be utilized.

INDUSTRIAL APPLICABILITY

Figure 16:
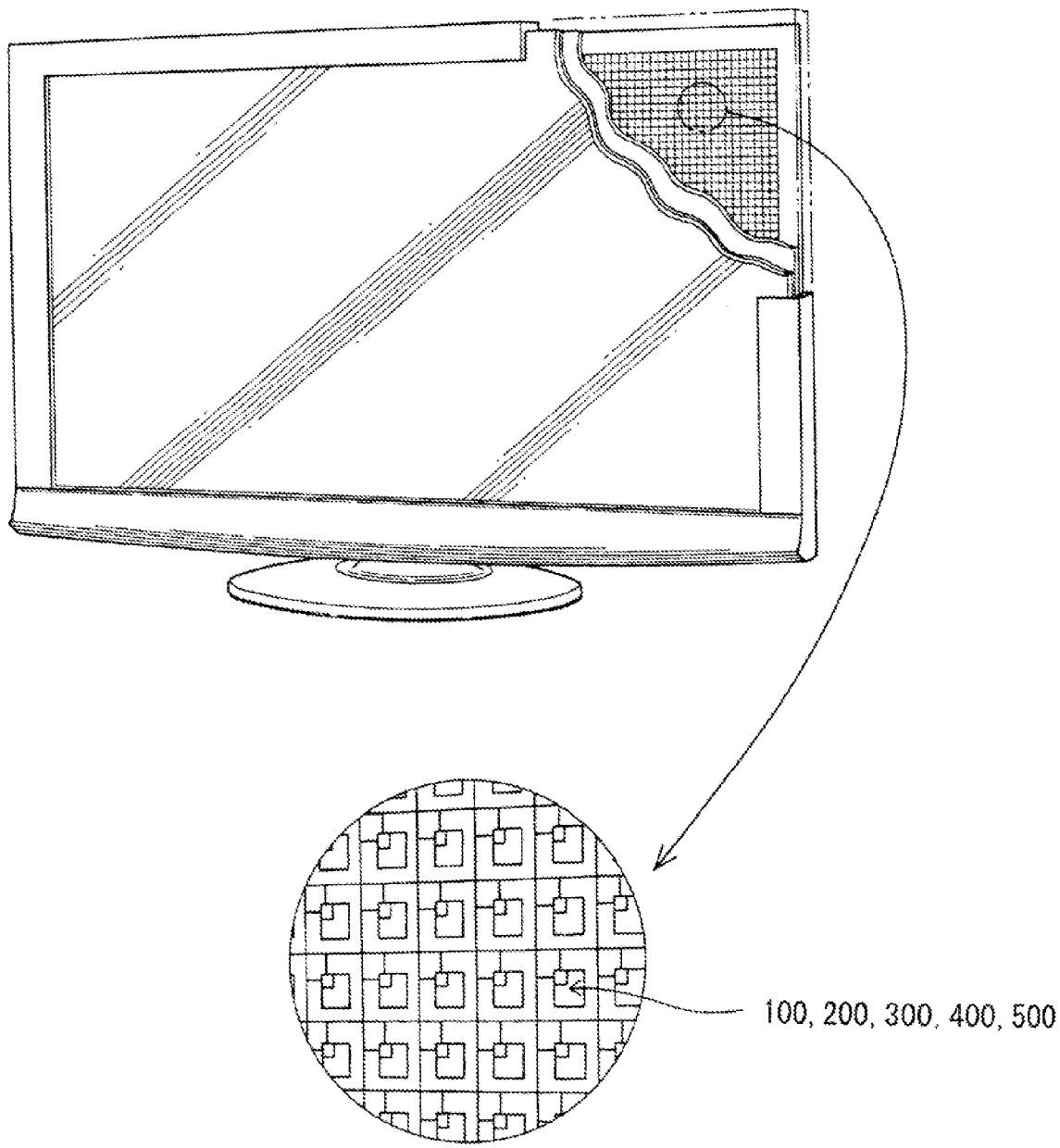
FIG. 16 shows an example of a product (an image display part of a television) wherein the flexible semiconductor device of the present invention is used.
Figure 17:
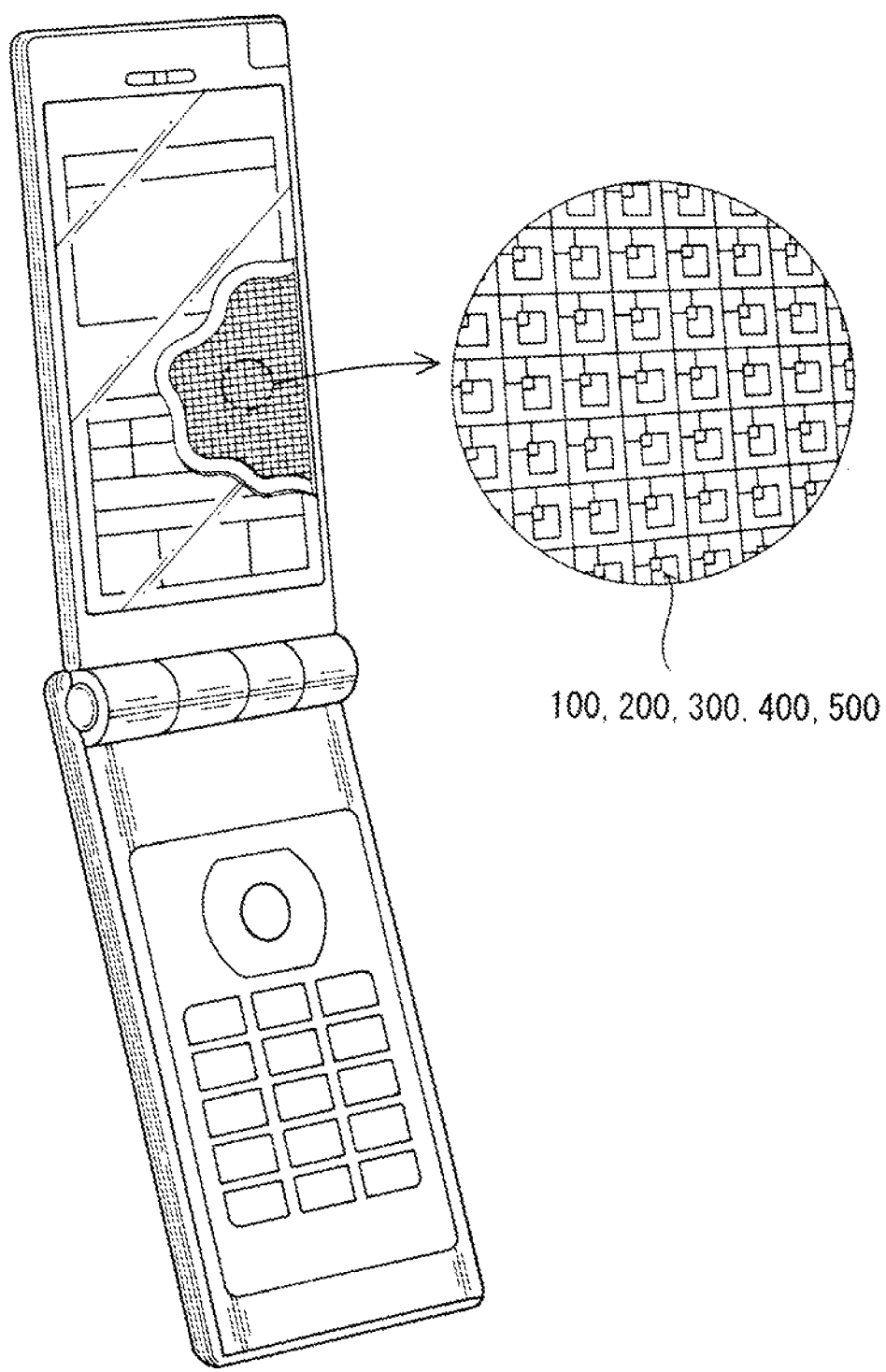
FIG. 17 shows an example of a product (an image display section of a cellular phone) wherein the flexible semiconductor device of the present invention is used.
Figure 18:
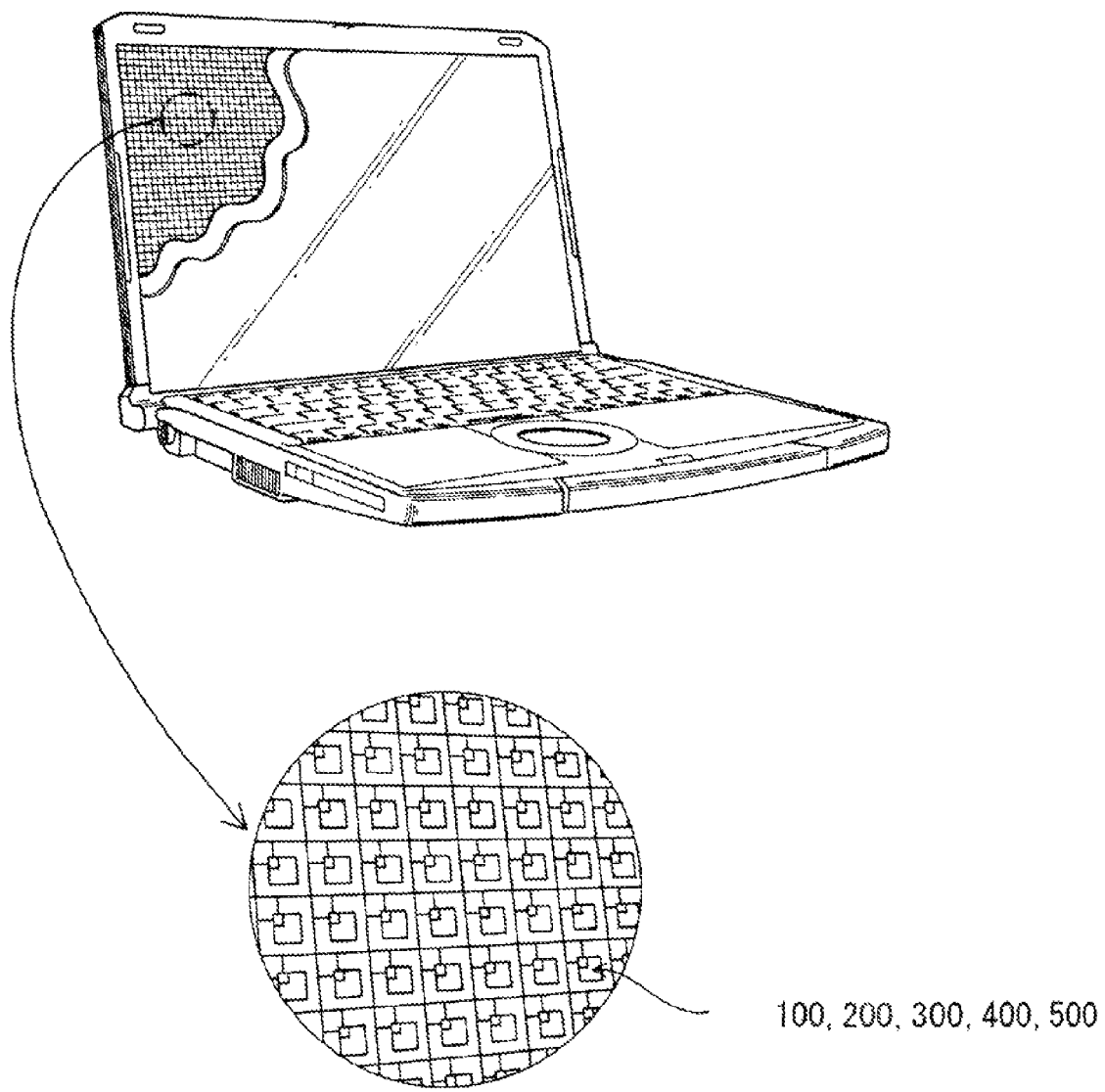
FIG. 18 shows an example of a product (an image display section of a mobile personal computer or a laptop computer) wherein the flexible semiconductor device of the present invention is used.
Figure 19:
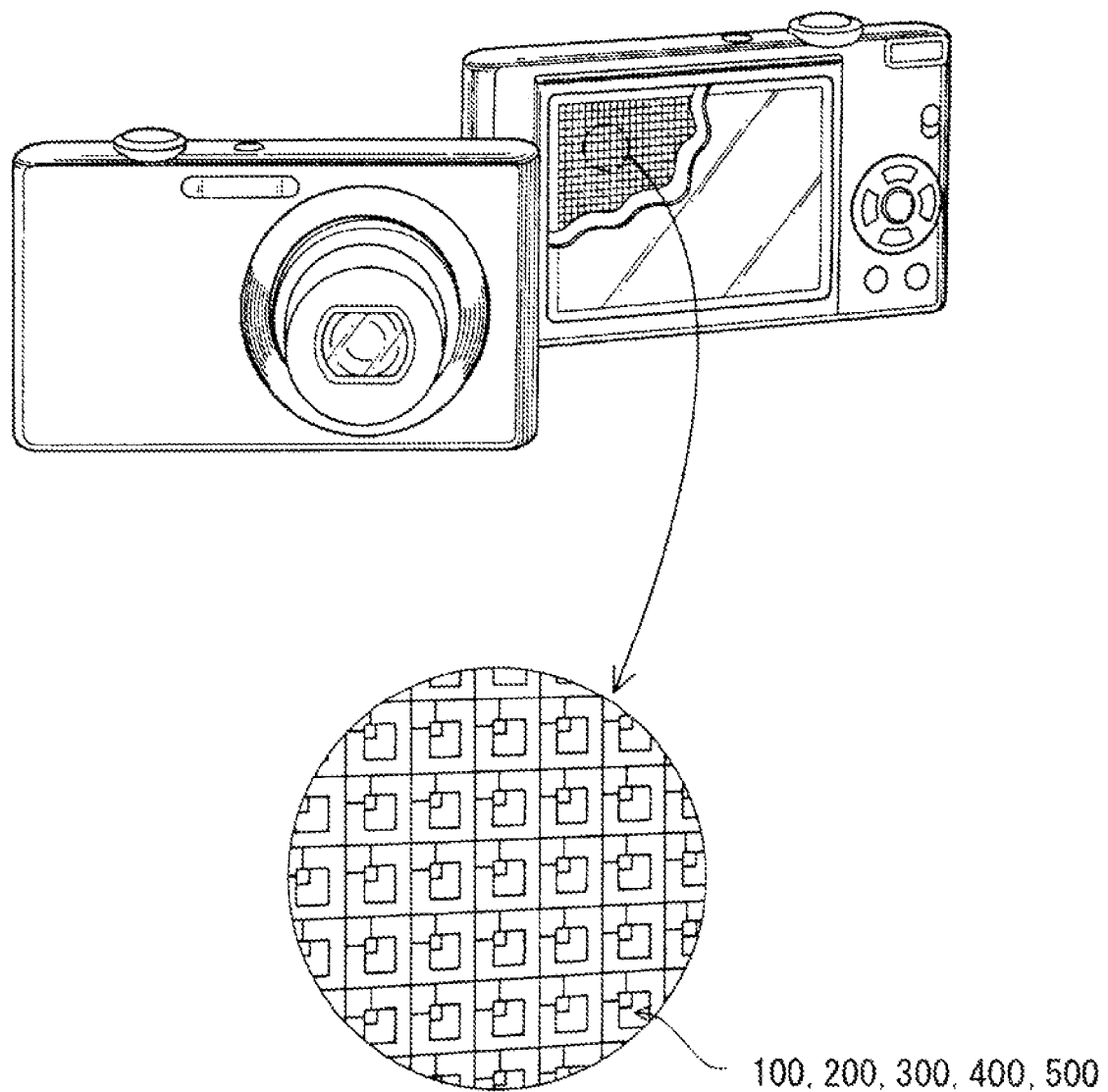
FIG. 19 shows an example of a product (an image display section of a digital still camera) wherein the flexible semiconductor device of the present invention is used.
Figure 20:
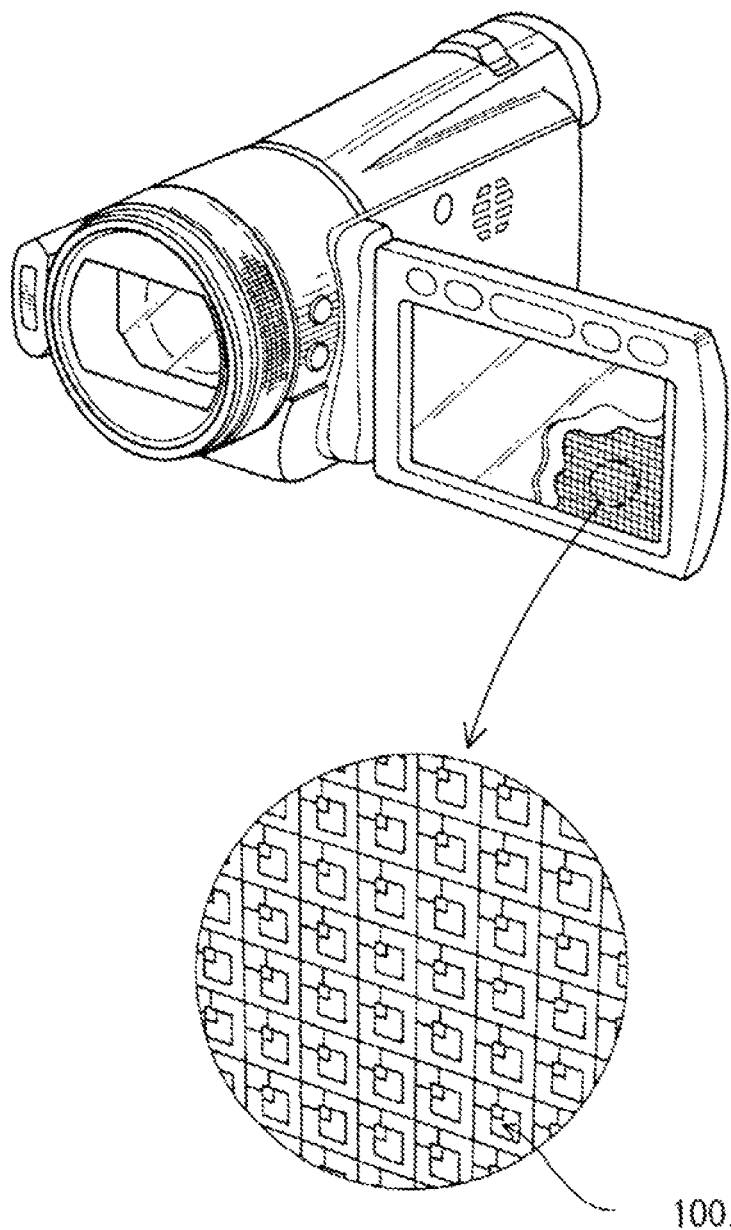
FIG. 20 shows an example of a product (an image display section of a camcorder) wherein the flexible semiconductor device of the present invention is used.
Figure 21:
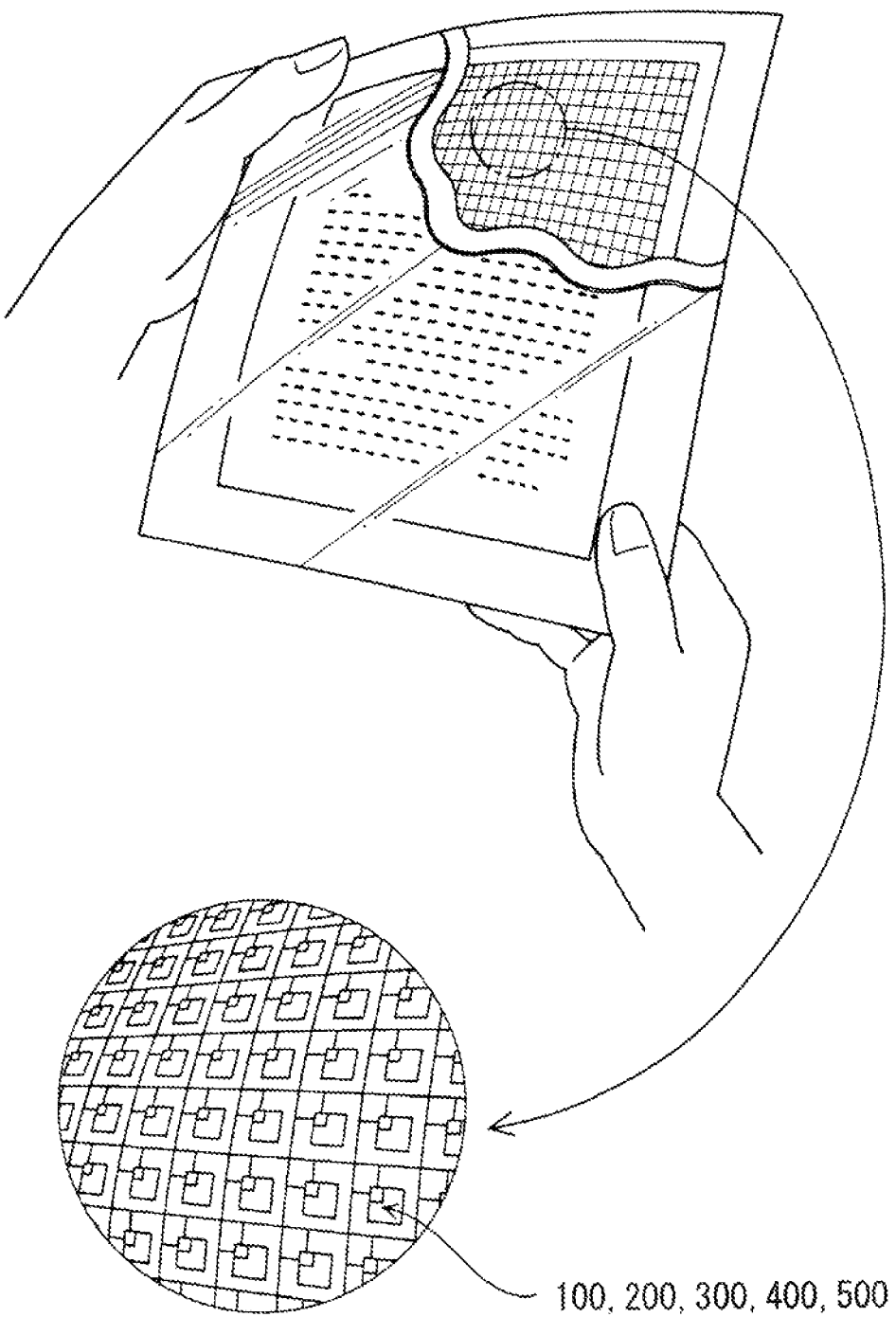
FIG. 21 shows an example of a product (an image display section of an electronic paper) wherein the flexible semiconductor device of the present invention is used.

The manufacturing method of the flexible semiconductor device of the present invention is excellent in the productivity of a flexible semiconductor device. The resulting flexible semiconductor device can also be used for various image display parts, and also can be used for an electronic paper, a digital paper and so forth. For example, the flexible semiconductor device can be used for a television picture indicator as shown in FIG. 16, the image display part of a cellular phone as shown in FIG. 17, the image display part of a mobile personal computer or a notebook computer as shown in FIG. 18, the image display part of a digital still camera and a camcorder as shown in FIGS. 19 and 20, the image display part of an electronic paper as shown in FIG. 21 and so on. The flexible semiconductor device obtained by the manufacturing method of the present invention can also be adapted for the various uses (for example, RF-ID, a memory, MPU, a solar battery, a sensor and so forth) which application is now considered to be adapted by the printing electronics.

CROSS REFERENCE TO RELATED PATENT APPLICATION

The present application claims the right of priority of Japan patent application No. 2008-294119 (filing date: Nov. 18, 2008, title of the invention: FLEXIBLE SEMICONDUCTOR DEVICE AND METHOD FOR MANUFACTURING THE SAME), the whole contents of which are incorporated herein by reference.

EXPLANATION OF REFERENCE NUMERALS

10: metal foil/metal layer
10A, 10B: metal foil/metal layer
12*d*: drain electrode
12*g*: gate electrode
12*s*: source electrode
12Ad: drain electrode
12Ag: gate electrode
12As: source electrode
12Bd: drain electrode
12Bg: gate electrode
12Bs: source electrode
14: first metal layer
15: wiring layer
16: second metal layer
17: via (via-hole)
18: interlayer
20: metal oxide film (surface metal oxide film)
20A, 20B: metal oxide film (surface metal oxide film)
22: gate insulating film
22A, 22B: gate insulating film
30: semiconductor layer
30A, 30B: semiconductor layer
32*s*, 32*d*: extended parts of a semiconductor layer
35: contact portion
40, 44, 46: non-oxidized portion/uncovered portion
40A, 40B: non-oxidized portion/uncovered portion
50*s*, 50*d*: extraction electrode
50As, 50Ad: extraction electrode
50Bs, 50Bd: extraction electrode
55: opening
60: resin layer
70: resist (resist layer/resist pattern)
80: capacitor
82: lower electrode layer
84: dielectric layer
86: upper electrode layer
92: data line
94: selection line
96: power source line
100, 200, 300, 400, 500: flexible semiconductor device
200A: switching transistor structure
200B: driving transistor structure
300A: switching transistor structure
300B: driving transistor structure

The invention claimed is:
1. A flexible semiconductor device comprising:
a metal layer comprising a gate electrode, a source electrode and a drain electrode;
a metal oxide film, wherein the metal oxide film is an oxidized portion of a surface region of the metal layer;
a semiconductor layer formed above the gate electrode via the metal oxide film; and
a first extraction electrode and a second extraction electrode,
wherein the first extraction electrode is arranged on the metal oxide film such that the metal oxide film is sandwiched between the first extraction electrode and the source electrode, and the second extraction electrode is arranged on the metal oxide film such that the metal oxide film is sandwiched between the second extraction electrode and the drain electrode, wherein uncovered portions are locally formed in the surface region of the metal layer such that each of the uncovered portions of the surface region of the metal layer is not covered with the metal oxide film, wherein, via the uncovered portions, the source electrode and the semiconductor layer are electrically interconnected, and also the drain electrode and the semiconductor layer are electrically interconnected, wherein the metal layer, from which the gate, source and drain electrodes are provided, is made of a metal foil, wherein each of the uncovered portions of the metal foil serves as an interlayer connecting portion, and a part of the oxidized portion of the metal foil is a gate insulating film, wherein the metal layer comprises a first metal layer and a second metal layer, wherein the first metal layer comprises a valve metal and the second metal layer comprises a metal other than the valve metal, wherein the metal oxide film is an anodic oxide film made from the valve metal, wherein the metal oxide film is an oxidized portion of a surface region of only the first metal layer, and wherein the oxidized portion of the surface region of the first metal layer includes an upper surface and side surfaces of the first metal layer.

2. The flexible semiconductor device according to claim 1, wherein the first and second extraction electrodes electrically interconnect between the semiconductor layer and each of the uncovered portions, the first and second extraction electrodes being positioned on the metal oxide film provided at the surface region of the metal foil.

3. The flexible semiconductor device according to claim 2, wherein the gate, source and drain electrodes which are made of the metal foil are positioned such that the gate, source and drain electrodes are all flush with each other.

4. The flexible semiconductor device according to claim 3, wherein each of the gate electrode, the source electrode and the drain electrode has a tapered form in the direction of thickness thereof.

5. The flexible semiconductor device according to claim 1, wherein an interlayer is formed between the first metal layer and the second metal layer.

6. The flexible semiconductor device according to claim 1, wherein the first and second extraction electrodes electrically interconnect between the semiconductor layer and each of the uncovered portions.

7. The flexible semiconductor device according to claim 1, wherein a part of the metal oxide film, which part is sandwiched between the gate electrode and the semiconductor layer, functions as a gate insulating film.

8. The flexible semiconductor device according to claim 7, further comprising a plurality of transistor structures, each of which comprises the semiconductor layer, the gate insulating film, the gate electrode, the source electrode and the drain electrode.

9. The flexible semiconductor device according to claim 8, further comprising a capacitor, wherein an electrode layer of the capacitor is formed of the metal layer and a dielectric layer of the capacitor is formed of the metal oxide film.

10. The flexible semiconductor device according to claim 9, wherein the flexible semiconductor device is a semiconductor device used for an image display device, wherein a drive circuit of the image display device comprises the transistor structure and the capacitor of the flexible semiconductor device, and wherein the metal oxide film is formed in a continuous arrangement in the region that contains the transistor structure and the capacitor.

11. The flexible semiconductor device according to claim 1, wherein the source electrode, the drain electrode and the gate electrode are flush with each other.

12. The flexible semiconductor device according to claim 1, wherein the first extraction electrode is arranged on the metal oxide film such that the metal oxide film is sandwiched between the first extraction electrode and the gate electrode, and the second extraction electrode is arranged on the metal oxide film such that the metal oxide film is sandwiched between the second extraction electrode and the gate electrode.

* * * * *